US012760427B2

United States Patent

(12) United States Patent
Harrington et al.

(10) Patent No.: US 12,760,427 B2
(45) Date of Patent: Oct. 13, 2026

(54) ELECTROLYZER SYSTEM CONVERTER ARRANGEMENT

(71) Applicant: Analog Devices, Inc., Wilmington, MA (US)

(72) Inventors: Brian Harrington, Upton, MA (US); Leonard Shtargot, Campbell, CA (US); Antonio Montalvo, Raleigh, NC (US)

(73) Assignee: Analog Devices, Inc., Wilmington, MA (US)

(*) Notice: Subject to any disclaimer, the term of this patent is extended or adjusted under 35 U.S.C. 154(b) by 650 days.

(21) Appl. No.: 18/201,084

(22) Filed: May 23, 2023

(65) Prior Publication Data

US 2023/0295811 A1 Sep. 21, 2023

Related U.S. Application Data

(63) Continuation of application No. 17/338,346, filed on Jun. 3, 2021, now Pat. No. 11,697,882.

(51) Int. Cl.
*C25B 1/04* (2021.01)
*C25B 9/65* (2021.01)
(Continued)

(52) U.S. Cl.
CPC .................. *C25B 1/04* (2013.01); *C25B 9/65* (2021.01); *C25B 9/70* (2021.01); *C25B 15/023* (2021.01);
(Continued)

(58) Field of Classification Search
None
See application file for complete search history.

(56) References Cited

U.S. PATENT DOCUMENTS

| | | | |
|---|---|---|---|
| 5,592,028 | A | 1/1997 | Pritchard |
| 7,892,407 | B2 | 2/2011 | Gibson et al. |

(Continued)

FOREIGN PATENT DOCUMENTS

| | | | |
|---|---|---|---|
| CN | 110768238 | A | 2/2020 |
| JP | 2004259762 | A | 9/2004 |

(Continued)

OTHER PUBLICATIONS

Lang et al., Electrochemical Quality Assurance of Solid Oxide Electrolyser (SOEC) Stacks, Journal of the Electrochemical Society, vol. 166, No. 16, Nov. 2019, pp. F1180-F1189 (Year: 2019).*

(Continued)

*Primary Examiner* — Harry D Wilkins, III

(74) *Attorney, Agent, or Firm* — Schwegman Lundberg & Woessner, P.A.

(57) ABSTRACT

Various examples are directed to a solar power electrolyzer system comprising a first electrolyzer stack, a second electrolyzer stack, a first converter and a first converter controller. The first electrolyzer stack may be electrically coupled in series with a photovoltaic array. The first converter may be electrically coupled in series with the first electrolyzer stack and electrically coupled in series with the photovoltaic array. The second electrolyzer stack electrically may be coupled at an output of the first converter. The first converter controller may be configured to control a current gain of the first converter.

20 Claims, 16 Drawing Sheets

(51) Int. Cl.

| | |
|---|---|
| ***C25B 9/70*** | (2021.01) |
| ***C25B 15/023*** | (2021.01) |
| ***G01R 19/165*** | (2006.01) |
| ***G01R 19/25*** | (2006.01) |
| ***H02J 3/38*** | (2026.01) |
| ***H02S 40/30*** | (2014.01) |
| *H02J 101/24* | (2026.01) |

(52) U.S. Cl.
CPC ... *G01R 19/16538* (2013.01); *G01R 19/2513* (2013.01); *H02J 3/381* (2013.01); *H02S 40/30* (2014.12); *H02J 2101/25* (2026.01)

(56) References Cited

U.S. PATENT DOCUMENTS

| | | | | |
|---|---|---|---|---|
| 7,906,007 | B2 | 3/2011 | Gibson et al. | |
| 8,999,135 | B2 | 4/2015 | Hinatsu et al. | |
| 2002/0033332 | A1 | 3/2002 | Handa | |
| 2005/0034998 | A1 | 2/2005 | Prerad | |
| 2005/0189234 | A1 | 9/2005 | Gibson et al. | |
| 2006/0065302 | A1 | 3/2006 | Gibson et al. | |
| 2010/0114395 | A1 | 5/2010 | Hinatsu et al. | |
| 2011/0155583 | A1 | 6/2011 | Li | |
| 2011/0200899 | A1 | 8/2011 | Mata et al. | |
| 2015/0021193 | A1* | 1/2015 | Verfu | C25B 1/46 204/229.8 |
| 2018/0291516 | A1 | 10/2018 | Nakao | |
| 2019/0127867 | A1 | 5/2019 | Yonezawa et al. | |
| 2021/0363651 | A1 | 11/2021 | Seymour et al. | |
| 2022/0112612 | A1 | 4/2022 | Montalvo et al. | |
| 2022/0267917 | A1 | 8/2022 | Zhang | |
| 2022/0389595 | A1 | 12/2022 | Harrington et al. | |

FOREIGN PATENT DOCUMENTS

| | | | |
|---|---|---|---|
| JP | 2007031813 | A | 2/2007 |
| JP | 6574891 | B2 | 9/2019 |
| KR | 101926008 | B1 | 12/2018 |
| KR | 102031252 | B1 | 10/2019 |
| KR | 20200046908 | A | 5/2020 |
| WO | WO-2009063104 | A1 | 5/2009 |
| WO | WO-2018216987 | A1 | 11/2018 |
| WO | WO-2021117096 | A1 | 6/2021 |

OTHER PUBLICATIONS

Jeppesen et al, An EIS alternative for impedance measurement of a high temperature PEM fuel cell stack based on current pulse injection, International Journal of Hydrogen Energy, vol. 42, No. 24, Jun. 2017, pp. 15851-15860 (Year: 2017).*

"U.S. Appl. No. 17/338,346, Notice of Allowance mailed Feb. 23, 2023", 9 pgs.

Dahbi, Sanae, et al., "Optimised hydrogen production by a photovoltaicelectrolysis system DC/DC converter and water flow controller", preprint, International Journal of Hydrogen Energy, (2016), 9 pgs.

Duc, Tuyen Nguyen, et al., "Optimization strategy for high efficiency 20 kW-class direct coupled photovoltaic-electrolyzer system based on experiment", International Journal of Hydrogen Energy, vol. 44, No. 49, (Oct. 2019), 26741-26752.

Garcia-Valverde, R, et al., "Optimized photovoltaic generator—water electrolyser coupling through a controlled DC-DC converter", International Journal of Hydrogen Energy, 33(20), (2008), 5352-5362.

Gul, Metin, et al., "Hydrogen Generation from a Small-Scale Solar Photovoltaic Thermal (PV/T) Electrolyzer System: Numerical Model and Experimental Verification", Energies, 13(11): 2997, (Jun. 10, 2020), 20 pgs.

Nacar, Salih, et al., "Hydrogen production system with fuzzy logic-controlled converter", Turkish Journal of Electrical Engineering and Computer Sciences, 27(3), (2019), 1885-1895.

Sahin, Mustafa Ergin, "An Efficient Solar-Hydrogen DC-DC Buck Converter System with Sliding Mode Control", El-Cezeri Journal of Science and Engineering, 6(3), (2019), 558-570.

Scamman, D, et al., "Off-grid solar-hydrogen generation by passive electrolysis", International Journal of Hydrogen Energy, 39(35), (2014), 19855-19868.

Yonezawa, et al., "Machine translation (WO 2021/117096 A1)", (2021).

* cited by examiner

ELECTROLYZER SYSTEM CONVERTER ARRANGEMENT

CLAIM OF PRIORITY

This application is a continuation of U.S. patent application Ser. No. 17/338,346, filed Jun. 3, 20221, which is incorporated by reference herein in its entirety.

FIELD OF THE DISCLOSURE

This document pertains generally, but not by way of limitation, to electrolysis cells.

BACKGROUND

Fuel cells are used to convert chemical energy (usually from hydrogen) to electrical energy. Since each fuel cell usually produces between 1 and 2 volts, oftentimes such fuel cells are stacked in series in order to produce a high power at a relatively low current. Hydrogen can also be generated with similar devices. Instead of hydrogen and oxygen as inputs and electrons as the desired output, the inputs are electricity and water and hydrogen is the desired output.

OVERVIEW

This disclosure describes, among other things, converter arrangements for electrolysis cells driven by a solar array. Example 1 is a solar-powered electrolyzer system comprising: a first electrolyzer stack electrically coupled in series with a photovoltaic array; a first converter electrically coupled in series with the first electrolyzer stack and electrically coupled in series with the photovoltaic array; a first converter controller configured to control a current gain of the first converter; and a second electrolyzer stack electrically coupled at an output of the first converter.

In Example 2, the subject matter of Example 1 optionally includes the first converter controller further being configured to perform operations comprising: determining that hydrogen production for the electrolyzer system has decreased by more than a hydrogen threshold amount over a first time period; determining that a current at the first electrolyzer stack has increased by more than a first current threshold over the first time period; and increasing the current gain of the first converter.

In Example 3, the subject matter of any one or more of Examples 1-2 optionally includes the first converter controller further being configured to perform operations comprising: determining that hydrogen production for the electrolyzer system has decreased by more than a hydrogen threshold amount over a first time period; determining that a current at the first electrolyzer stack has decreased by more than a second current threshold over the first time period; and decreasing the current gain of the first converter.

In Example 4, the subject matter of any one or more of Examples 1-3 optionally includes the first converter controller being configured to perform operations comprising modifying the current gain of the first converter to maintain a power dissipated by the electrolyzer system below a power threshold.

In Example 5, the subject matter of any one or more of Examples 1-4 optionally includes the first converter controller being configured to perform operations comprising: determining that a power produced by the photovoltaic array is greater than a threshold; and responsive to determining that the power produced by the photovoltaic array is greater than the threshold, reducing the current gain of the first converter.

In Example 6, the subject matter of any one or more of Examples 1-5 optionally includes an excitation signal generator to generate a reference excitation signal, the first converter controller being configured to perform operations comprising modulating the current gain of the first converter using the reference excitation signal.

In Example 7, the subject matter of any one or more of Examples 1-6 optionally includes a second photovoltaic array; a second converter electrically coupled in series with the first electrolyzer stack and in series with the second photovoltaic array, the second electrolyzer stack being electrically coupled at an output of the second converter; and a second converter controller configured to control a current gain of the second converter.

In Example 8, the subject matter of Example 7 optionally includes a third photovoltaic array; a third converter electrically coupled in series with the first electrolyzer stack and in series with the third photovoltaic array; a third load electrically coupled at an output of the third converter; and a third converter controller configured to control a current gain of the third converter.

Example 9 is a method of operating a solar-powered electrolyzer system, the electrolyzer system comprising a first electrolyzer stack electrically coupled in series with a photovoltaic array; a first converter electrically coupled in series with the first electrolyzer stack and electrically coupled in series with the photovoltaic array; a first converter controller configured to control a current gain of the first converter; and a second electrolyzer stack electrically coupled at an output of the first converter, the method, comprising: determining, by the first converter controller, that hydrogen production for the electrolyzer system has decreased by more than a hydrogen threshold amount over a first time period; determining, by the first converter controller, that a current at the first electrolyzer stack has increased by more than a first current threshold over the first time period; and increasing, by the first converter controller, the current gain of the first converter.

In Example 10, the subject matter of Example 9 optionally includes determining, by the first converter controller, that hydrogen production for the electrolyzer system has decreased by more than a hydrogen threshold amount over a first time period; determining, by the first converter controller, that a current at the first electrolyzer stack has decreased by more than a second current threshold over the first time period; and decreasing, by the first converter controller, the current gain of the first converter.

In Example 11, the subject matter of any one or more of Examples 9-10 optionally includes modifying the current gain of the first converter to maintain a power dissipated by the electrolyzer system below a power threshold.

In Example 12, the subject matter of any one or more of Examples 9-11 optionally includes determining, by the first converter controller, that a power produced by the photovoltaic array is greater than a threshold; and responsive to determining that the power produced by the photovoltaic array is greater than the threshold, reducing, by the first converter controller, the current gain of the first converter.

In Example 13, the subject matter of any one or more of Examples 9-12 optionally includes generating, by an excitation reference signal generate, a reference excitation signal; and modulating, by the first converter controller, the current gain of the first converter using the reference excitation signal.

In Example 14, the subject matter of any one or more of Examples 9-13 optionally includes controlling, by a second converter controller, a current gain of a second converter electrically coupled in series with the first electrolyzer stack and in series with a second photovoltaic array, the second electrolyzer stack being electrically coupled at an output of the second converter.

In Example 15, the subject matter of Example 14 optionally includes controlling, by a third converter controller, a current gain of a third converter, the third converter electrically coupled in series with the first electrolyzer stack and in series with a third photovoltaic array, a third load being electrically coupled at an output of the third converter.

Example 16 is a solar-powered electrolyzer system comprising: a first electrolyzer stack electrically coupled in series with a photovoltaic array; a first converter electrically coupled in series with the first electrolyzer stack and electrically coupled in series with the photovoltaic array; a second electrolyzer stack electrically coupled at an output of the first converter; and means for controlling a current gain of the first converter.

In Example 17, the subject matter of Example 16 optionally includes means for determining that hydrogen production for the electrolyzer system has decreased by more than a hydrogen threshold amount over a first time period; means for determining that a current at the first electrolyzer stack has increased by more than a first current threshold over the first time period; and means for increasing the current gain of the first converter.

In Example 18, the subject matter of any one or more of Examples 16-17 optionally includes means for determining that hydrogen production for the electrolyzer system has decreased by more than a hydrogen threshold amount over a first time period; means for determining that a current at the first electrolyzer stack has decreased by more than a second current threshold over the first time period; and means for decreasing the current gain of the first converter.

In Example 19, the subject matter of any one or more of Examples 16-18 optionally includes means for modifying the current gain of the first converter to maintain a power dissipated by the electrolyzer system below a power threshold.

In Example 20, the subject matter of any one or more of Examples 16-19 optionally includes means for determining that a power produced by the photovoltaic array is greater than a threshold; and means for responsive to determining that the power produced by the photovoltaic array is greater than the threshold, reducing the current gain of the first converter.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
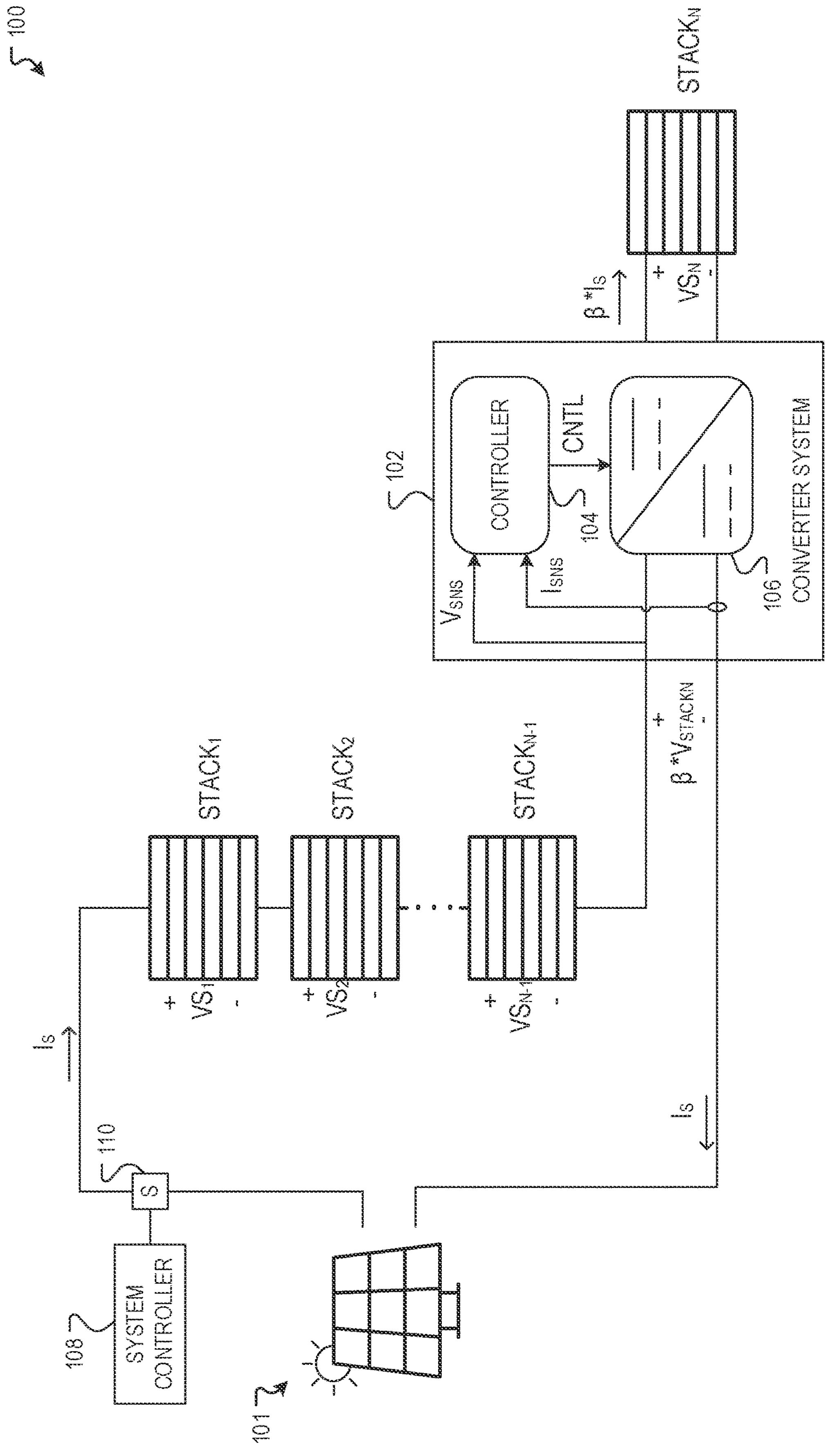
FIG. 1 is a block diagram of an example of an electrolyzer system.

This disclosure describes, among other things, techniques to configure an electrolyzer or hydrolyzer to generate hydrogen and/or oxygen.

An electrolyzer typically includes one or more electrolytic cells. Each electrolytic cell has three component parts: an electrolyte and two electrodes (a cathode and an anode). The electrolyte is usually a solution of water or other solvents in which ions are dissolved. Molten salts such as sodium chloride are also electrolytes. When driven by an external voltage applied to the electrodes, the ions in the electrolyte are attracted to an electrode with the opposite charge, where charge-transferring (also called faradaic or redox) reactions can take place. Only with an external electrical potential (i.e., voltage) of correct polarity and sufficient magnitude can an electrolytic cell decompose a normally stable, or inert chemical compound in the solution. The electrical energy provided can produce a chemical reaction which would not occur spontaneously otherwise. Water, particularly when ions are added (salt water or acidic water), can be electrolyzed (subject to electrolysis). When driven by an external source of voltage, H+ ions flow to the cathode to combine with electrons to produce hydrogen gas in a reduction reaction. Likewise, OH− ions flow to the anode to release electrons and an H+ ion to produce oxygen gas in an oxidation reaction.

A system that generates hydrogen through electrolysis is called an electrolyzer or a hydrolyzer system. An electrolyzer system includes a number of electrolytic cells, with each electrolytic cell including an electrolyte and two electrodes. In some examples, a number of electrolytic cells are electrically coupled in series to form electrolytic cell stacks, also referred to as electrolyzer stacks. An electrolyzer system may include one or more electrolyzer stacks arranged in various ways, for example, as described herein. An electrolyzer system may also include a power generation system. The power generation system produces a high voltage (between 50V and 200V) and a high current (100A to 4000A) that is provided to one or more electrolytic cell stacks. With water as the other input, the electrolyzer stack or stacks produce hydrogen and oxygen as outputs. If a renewable power generation system is used, such as solar, wind, or hydroelectric, then the entire cycle is completely carbon free.

An electrolyzer system may also include a power converter to manage the current and/or voltage provided to the electrolyzer stack or stacks. The converter may be configured to optimize the operating conditions of the electrolyzer system. For example, the optimal operating conditions of the electrolyzer stack or stacks can depend on physical properties of the electrolytic cells such as, for example, cell temperature, electrolyte conditions, the physical condition of the electrodes, etc. When a variable source of power, such as a photovoltaic array, is used to power the electrolyzer system, additional power conditioning may be desirable to match the performance of the electrolyzer stack to the operating conditions of the power source.

One arrangement for managing an electrolyzer stack with a variable power source can include electrically coupling a direct current (DC)/DC converter in parallel between the variable power source and the electrolyzer stack. This arrangement, however, presents several disadvantages. For example, a DC/DC converter coupled in this way converts all of the power provided to the electrolyzer stack. As a result, any inefficiencies introduced by the DC/DC converter are applied to the total power delivered to the electrolyzer stack. Also, in this arrangement, the DC/DC converter is subject to the full voltage and generated by the power source and applied to the electrolyzer stack. As described above, this can be considerable. DC/DC converters with components specified for high voltages may be more expensive and may slower or otherwise inferior switching characteristics.

In some examples, these and other issues are addressed using a fractional converter arrangement. An electrolyzer system can be arranged into multiple electrolyzer stacks, where each stack comprises one or more electrolytic cells electrically coupled in series with one another. A first electrolyzer stack is electrically coupled in series with a variable power source, such as a photovoltaic array and in series with a converter, such as a DC/DC converter. A second electrolyzer stack, referred to herein as a balance electrolyzer stack, is electrically coupled in parallel with the converter. For example, the balance electrolyzer stack may be electrically coupled to an output of the converter. The converter is configured to apply a current gain β to a stack current Is of the first electrolyzer stack. The resulting current Ib is applied to the balance electrolyzer stack. Modifying the current gain β of the converter may also modify the effective impedance of the converter, thereby changing the stack current Is.

In this arrangement, the converter can affect the stack current by modifying the current gain β. Changes to the current gain β result in corresponding changes to the effective impedance of the combination of the converter and the balance stack. This changes the impedance of the load to the power supply and the corresponding stack current Is. Because the converter is not in parallel with the full load (e.g., all of the electrolytic cells), it need not drop the full load voltage. Accordingly, the converter may be constructed with switching resistors and other components having lower voltage tolerances and faster switching times. Further, any inefficiencies introduced by the converter may affect the balance stack but have a more limited effect on the other electrolytic cells.

In various examples, the converter comprises a controller that is configured to modify the current gain β of the converter to manage the operation of the electrolyzer system. In some examples, the converter controller is configured to modify the current gain β of the converter to maximize the rate of hydrogen production. For example, the rate of hydrogen production may depend on the power provided to the electrolyzer system as well as the temperature and pressure conditions as the electrolytic cell. Further, the current and voltage providing maximum available power from a photovoltaic array power supply depends on the amount of available sunlight, which may be expressed in terms of the irradiance at the array.

The dependencies between current, voltage, irradiance, temperature, and pressure may be difficult to measure and/or model in order to optimize hydrogen production in real time. Various examples, described herein maximize the rate of hydrogen production by monitoring the rate of hydrogen production and the stack current Is. If the converter controller determines that the rate of hydrogen production has dropped by more than a threshold amount and the stack current Is has increased by more than a threshold amount, it may decrease the value of the current gain β. If the converter controller determines that the rate of hydrogen production has dropped by more than a threshold amount and the stack current Is has decreased by more than a threshold amount, it may increase the value of the current gain β.

In some examples, the converter controller is configured to manage the current gain β of the converter to operate the electrolyzer system at less than a threshold power level. For example, because of changes to the irradiance incident on the photovoltaic array over the course of a day, the maximum power of a photovoltaic array may only be available for a minority of the time that the photovoltaic array is operational. Accordingly, it may not be cost effective to specify components of the electrolyzer to operate at the maximum power level available from the photovoltaic array. Instead, the electrolyzer system may be specified with components that are suitable for operating up to a threshold power level less than the maximum power of the photovoltaic array. The converter controller may be configured to determine when the power delivered by the photovoltaic array is at or near the threshold power level and may make an appropriate adjustment to the current gain β to prevent the electrolyzer system from being overpowered.

In some examples, the converter controller, or other suitable electrolyzer controller circuitry, is configured to manage the turn-on and turn-off of the electrolyzer system. For example, turning on the electrolyzer system may involve providing water at a given pressure to the electrolytic cells and may include various priming and other preparatory steps. These preparatory steps may be energy-consuming and may also cause wear and tear on the electrolyzer system. Accordingly, in some examples, the controller is configured to manage the electrolyzer system to avoid unnecessary turn-ons and turn-offs. For example, the controller may determine a turn-on power threshold considering factors such as, for example, a current weather state, a time of day, a time of year, etc. When the power produced by the photovoltaic array exceeds the turn-on threshold, the controller may initiate a turn-on of the electrolyzer system. Similarly, the controller may determine a turn-off threshold power. The turn-off threshold power may be less than the turn-on power threshold. When the power produced by the photovoltaic array drops below the turn-off threshold power, the controller may turn-off the electrolyzer system.

In some examples, a converter controller may be configured to implement electrochemical impedance spectroscopy (EIS) or another suitable technique for monitoring a status of the electrolytic cells of the electrolyzer system. According to an EIS technique, the impedances of the electrolytic cells are measured while under excitation over a range of frequencies. The impedance of the electrolytic cells over the range of excitation frequencies can reveal information about the state of the electrolytic cells including, for example, whether the cells have suffered damage or wear.

In the various architectures described herein, the converter controller can be configured to provide an excitation signal to the electrolytic cells by modifying the current gain β of the converter. For example, an excitation signal may be added to a bias signal to generate an excitation signal. The present stack current Is may be subtracted from the excitation signal to generate an error signal. The error signal may be provided to the controller, which may modify the current gain β of the controller to add the excitation signal to the stack current Is.

In some examples, multiple converters may be provided in parallel. The parallel converters may be coupled in series with the first electrolyzer stack and in parallel with the balance stack. In some examples, each of the parallel converters may be individually coupled in series with a distinct photovoltaic array. The current gains β of the controllers may be modulated, as described herein, for its respective photovoltaic array and the electrolyzer stacks. In another examples, multiple converters may be provided in parallel, as described herein, where one or more of the converters is electrically coupled to a separate load other than the balance stack.

FIG. 1 is a block diagram of an example of an electrolyzer system 100. In the example of FIG. 1, the electrolyzer system 100 includes N electrolyzer stacks labeled 1-through N. Each of the electrolyzer stacks 1-N includes one or more electrolytic cells. The electrolyzer stacks 1-N are powered by a photovoltaic array 101. The photovoltaic array 101 includes one or more photovoltaic cells that may be positioned to receive sunlight to provide power.

The electrolyzer stacks 1 through N−1 are coupled in series with the photovoltaic array. An example converter system 102 is provided electrically coupled in series with the electrolyzer stacks 1 through N−1 and the photovoltaic array. The electrolyzer stack Nis coupled to an output of the converter system 102 in parallel with the converter system 102. The converter system 102 comprises a converter 106 and a converter controller 104. The converter 104 may be a DC/DC converter using any suitable DC/DC converter topology such as, for example, a boost topology, a buck topology, or a buck-boost topology. The converter controller 104 provides a control signal CNTL to the converter 106, where the control signal CNTL configures the current gain β of the converter 106. The converter controller 104 may modify the control signal CNTL, as described herein, for example based on a sensed current Isns and/or a sensed voltage Vsns.

In some examples, the electrolyzer system 100 also includes a system controller 108 and switch 110 for selectively turning the electrolyzer system 100 on or off. For example, when the switch 110 is closed, it may electrically couple the photovoltaic array 101 to the respective stacks 1-N and converter system 102. When the switch 110 is open, the photovoltaic array 101 may be electrically disconnected from the respective stacks 1-N and converter system. In some examples, the system controller 108 also controls various other equipment for turning the electrolyzer system 100 on and off. For example, the system controller 108 may control various pumps, valves, and/or other components for providing water, electrolyzer, etc. to the electrolytic cells of the various stacks 1-N.

The stack current Is is provided by the photovoltaic array 101 to the electrolyzer stacks 1 through N−1. The converter 104 applies the current gain β to the stack current Is such that the current at the balance stack Nis given by Equation [1] below:

$$I_N=\beta I_S \quad [1]$$

In Equation [1], $I_N$ is the current at the balance stack N. In the example arrangement of FIG. 1, the effective impedance of the converter system 102 and balance stack N is given by Equation [2] below:

$$Z_{EFF}=Z_{STACKN}/\beta^2 \quad [2]$$

In Equation [2], $Z_{EFF}$ is the effective impedance of the converter system 102 and balance stack. $Z_{STACKN}$ is the impedance of the balance stack N. For the example of FIG. 1, the total load impedance $Z_T$ is given by Equation [3] below:

$$Z_T=Z_{STACK1}+Z_{STACK2}+\ldots Z_{STACKN}/\beta^2 \quad [3]$$

The stack current Is is given by Equation [4] below:

$$I_S=V/Z_T \quad [4]$$

In Equation [4], Vis the load voltage, given by Equation [5] below:

$$V=VS_1+VS_2+VS_{N-1}\ldots\beta VS_N \quad [5]$$

In Equation [5], $VS_1$, $VS_2$, $VS_{N-1}$, and $VS_N$ are the voltage drops over the respective electrolyzer stacks 1 through N.

As can be seen from Equation [3], a decrease in the current gain β of the converter 106 will tend to increase the load impedance $Z_T$, leading to a reduction in the stack current Is. On the other hand, an increase in the current gain β of the converter 106 will tend to decrease the load impedance $Z_T$, leading to an increase in the stack current Is. The degree to which changes in the current gain β of the converter 104 affects the stack current Is may depend, for example, on a ratio of the number of electrolytic cells in the stacks 1 through N−1 to the number of electrolytic cells in the stack N.

Figure 2:
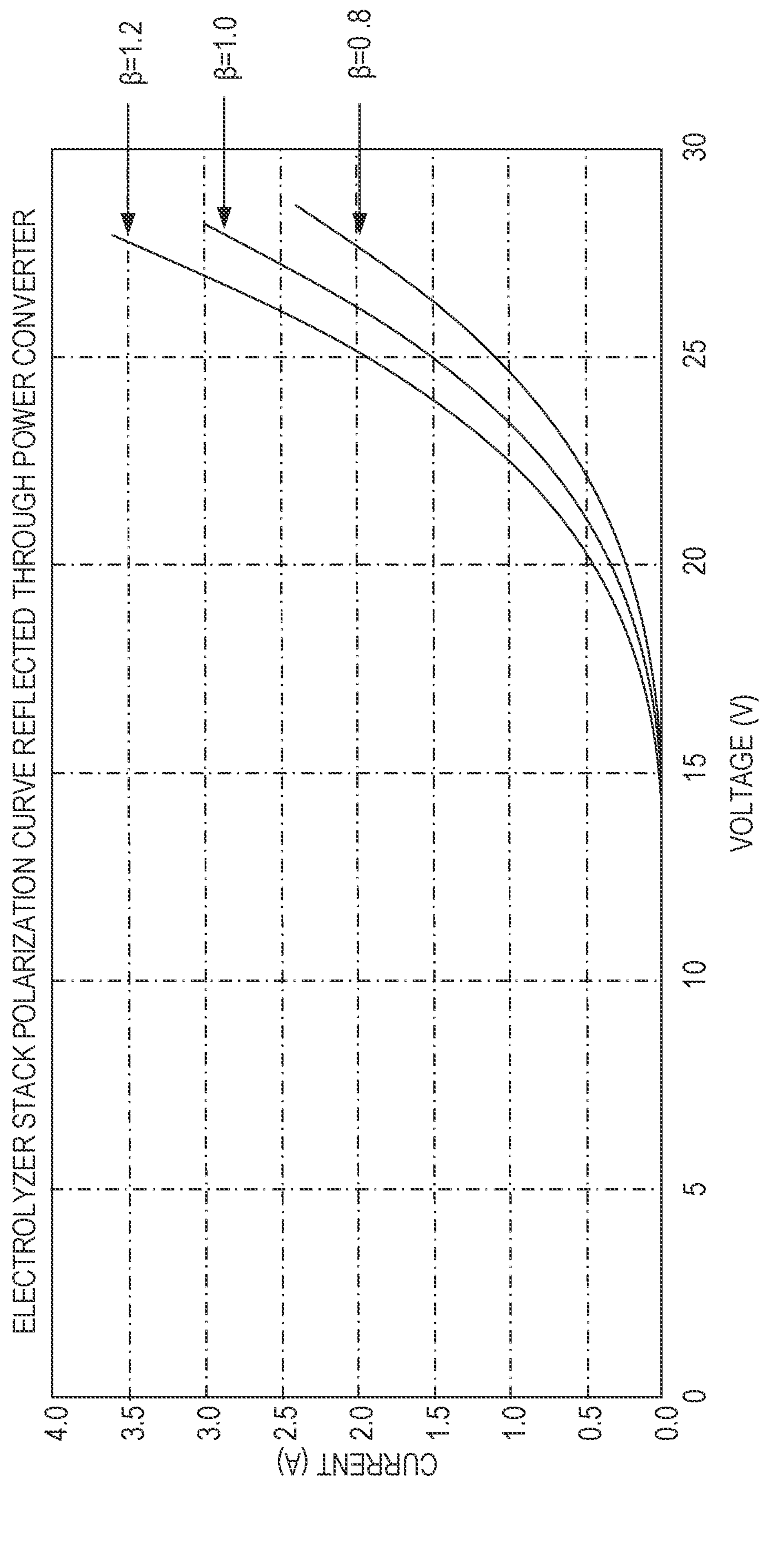
FIG. 2 is a diagram showing current-voltage (IV) curves for the electrolyzer stacks 1-N for different values of the current gain β of the converter of FIG. 1.

FIG. 2 is a diagram showing current-voltage (IV) curves for the electrolyzer stacks 1-N for different values of the current gain β of the converter 106. In the example of FIG. 2, the horizontal axis indicates the load voltage V and the vertical axis indicates the stack current Is. As shown, for lower values of the current gain β, the stack current Is will be lower for a given load voltage. Similarly, higher values of the current gain β may lead to higher values for the stack current Is for a given load voltage.

Figure 3:
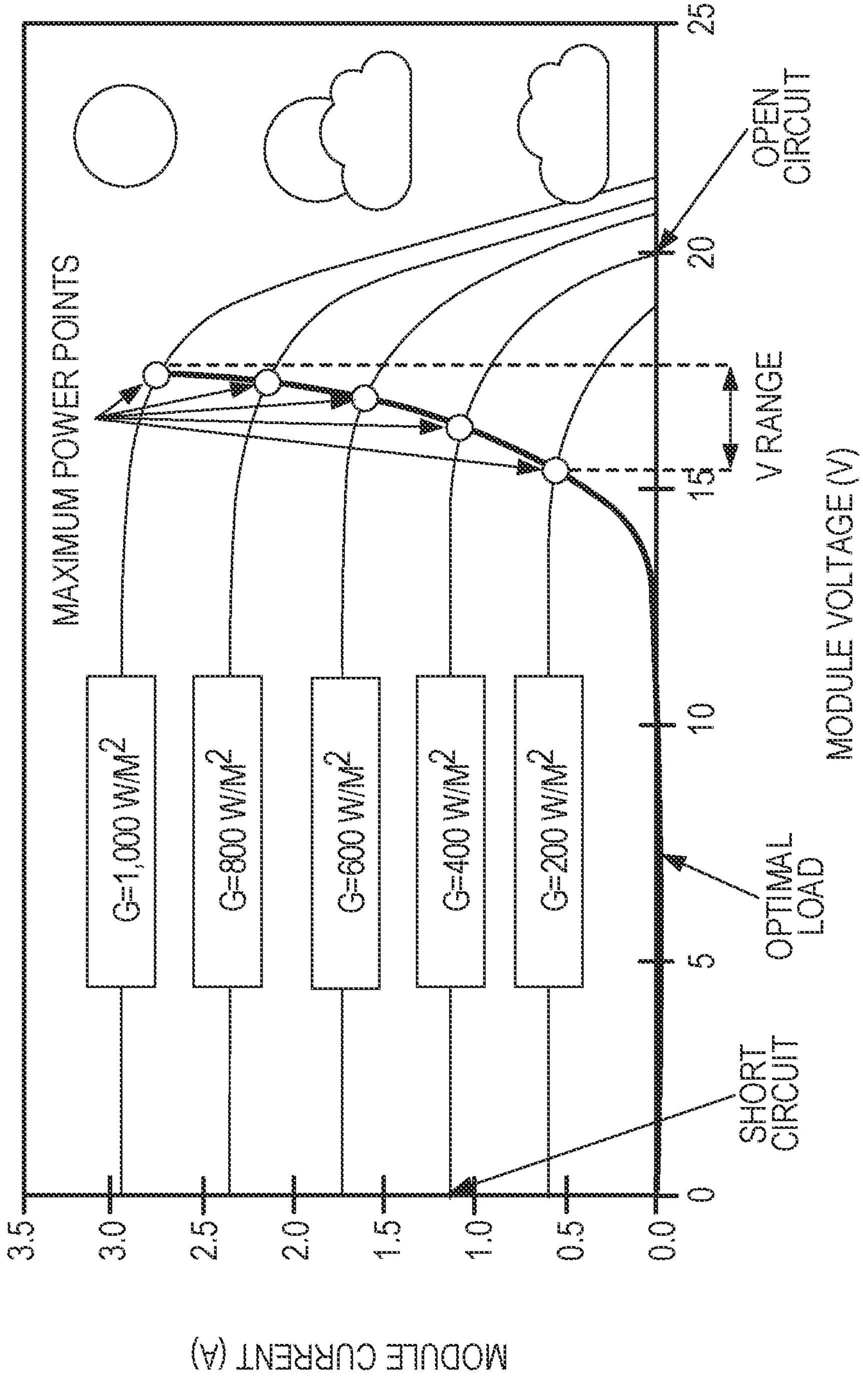
FIG. 3 is a diagram showing IV curves for an example photovoltaic array.

As described herein the example arrangement of FIG. 1 with one or more electrolyzer stacks in series with the photovoltaic array and a balance stack in parallel with the converter system, the current gain β may be modulated to achieve maximum hydrogen production at the electrolytic cells. The maximum attainable hydrogen production, in some examples, is related to the power delivered by the photovoltaic array. FIG. 3 is a diagram showing IV curves for an example photovoltaic array. FIG. 3 includes curves for irradiances of 200 $W/m^2$, 800 $W/m^2$, 600 $W/m^2$, 400 $W/m^2$, and 200 $W/m^2$, as labeled. As shown, for a given irradiance, the current provided by the example photovoltaic array is constant as voltage increases until reaching a knee and beginning to decline. For higher irradiances, the photovoltaic array produces a higher current that reaches the knee at a higher voltage, but drops off faster.

FIG. 3 also shows an optimal load curve illustrating the load that will receive the most power from the example photovoltaic array under different conditions. The intersection between the optimal load curve and the PV curve for the photovoltaic cell under given irradiance conditions indicates the maximum power that can be delivered by the photovoltaic array at that irradiance. As shown, depending on irradiance conditions, the voltage and current produced by the photovoltaic array at maximum power varies.

As described herein, the optimal hydrogen production rate for an electrolyzer system may depend on the irradiance incident on the photovoltaic array and the temperature of the various electrolyzer stacks. In some examples, the rate of hydrogen production H may be given generally be Equation [6] below:

$$H=\eta(Is,T,P)\times Is\times V=Is\times V_{TH} \qquad [6]$$

In Equation [6], η is the efficiency of the electrolytic cells which, as shown, is a function of the stack current Is, the temperature T of the electrolytic cells and the pressure P at the electrolytic cells. The efficiency η multiplied by the load voltage V is the thermal voltage VTH.

Figure 4:
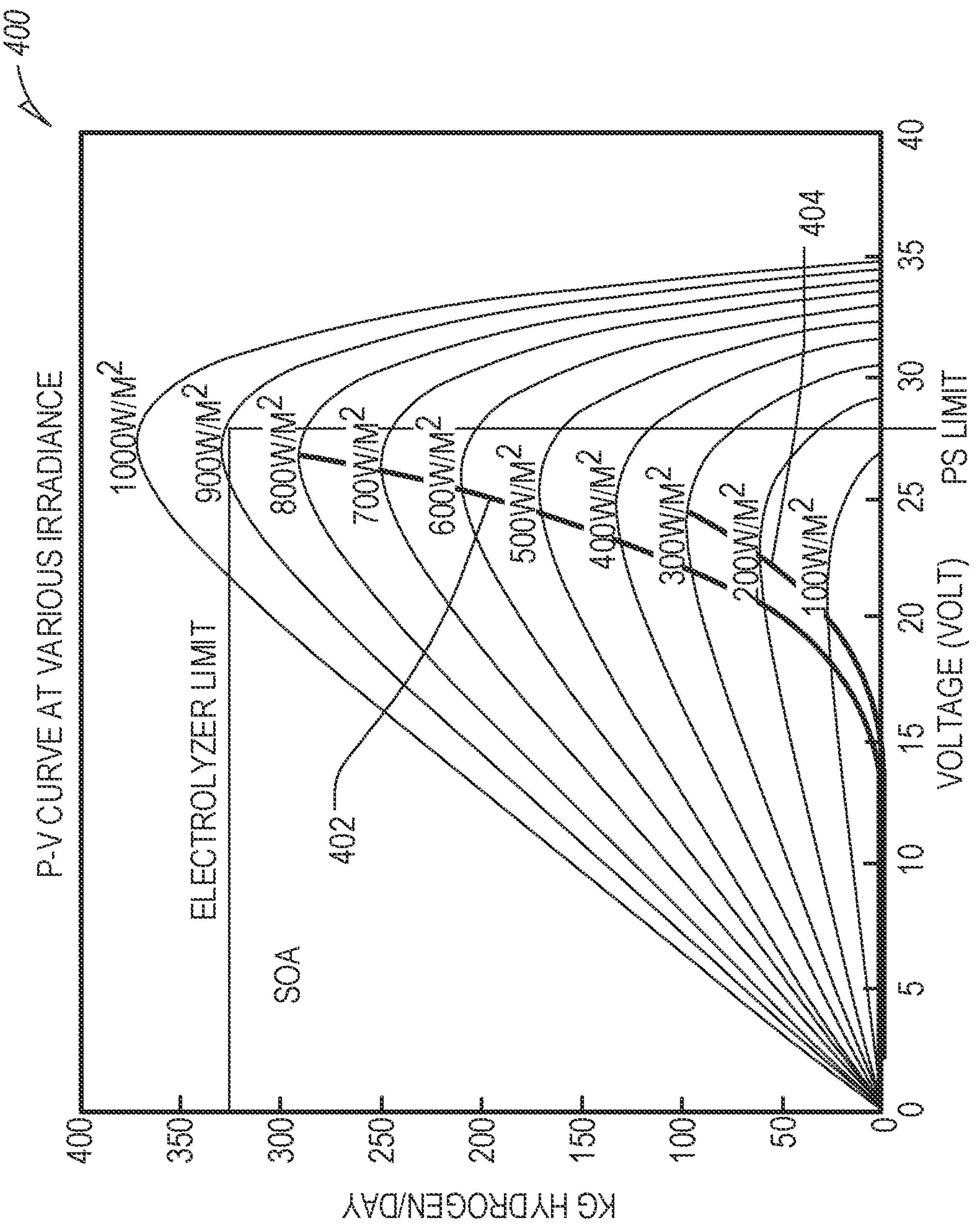
FIG. 4 is a diagram showing an example hydrogen production curve over different levels of irradiance incident on the photovoltaic array.
Figure 5:
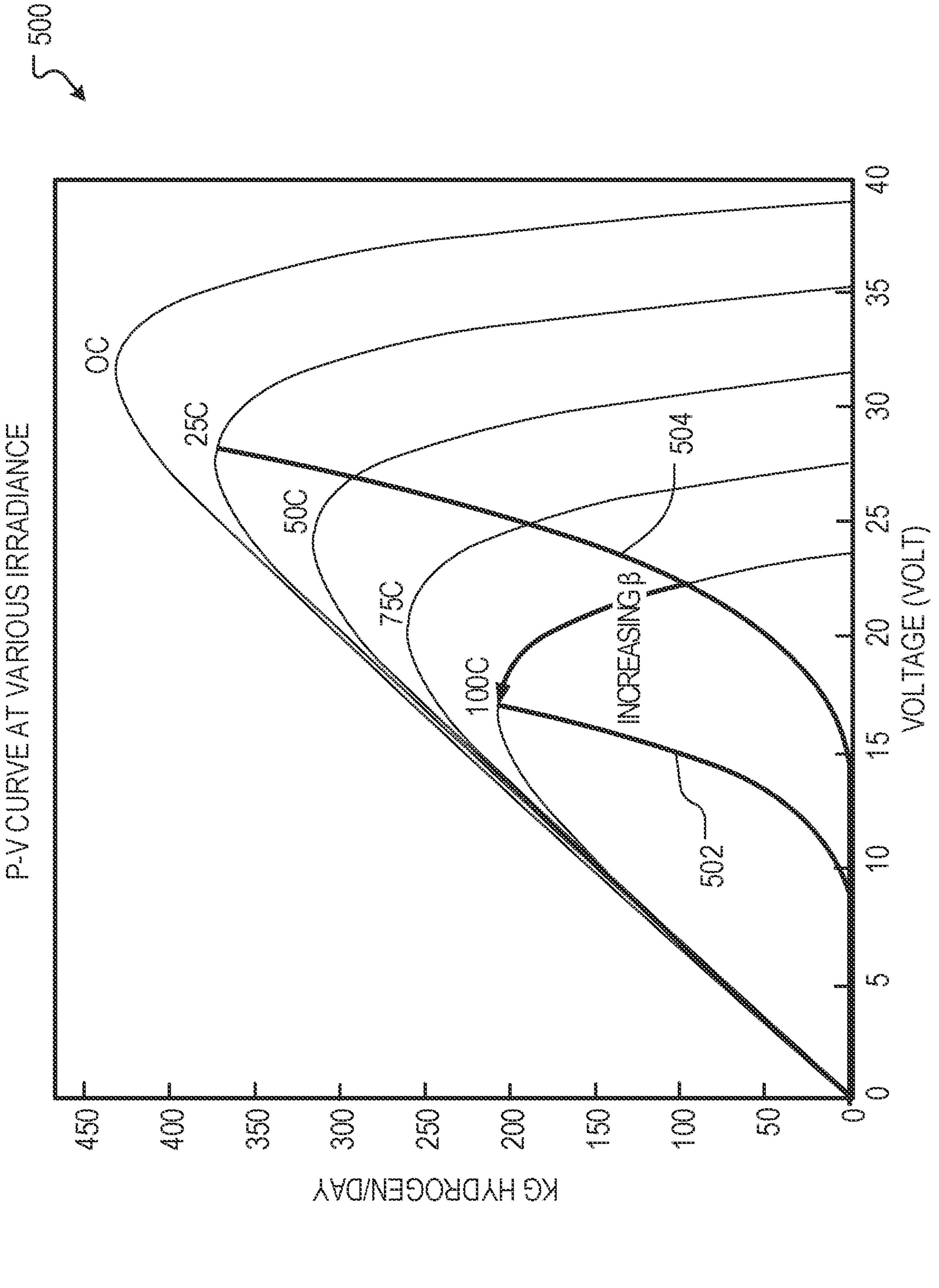
FIG. 5 is a diagram showing an example hydrogen production curve over different temperatures of the electrolytic cells.

FIGS. 4 and 5 include charts showing hydrogen production-voltage curves 400, 500 demonstrating relationships between hydrogen production and the load voltage over different operating parameters, such as different irradiances (FIG. 4) and different electrolyzer temperatures (FIG. 5). Referring first to FIG. 4, the horizontal axis indicates voltage and the vertical axis indicates hydrogen production rate in kilograms (kg) per day for various example arrangements. The curves labeled with irradiance values (1000 $W/m^2$, 900 $W/m^2$, 800 $W/m^2$, etc.) show example shapes for a relationship between hydrogen production rate and load voltage at different irradiances. Load curves 402, 404 show curves that may represent the load (e.g., the various electrolyzer stacks) for various values of the current gain β of the converter. For example, the curve 402 represents a higher value of the current gain β than the curve 404. The actual load voltage and across the electrolyzer stacks may fall on a load curve, such as the load curves 402, 404, that correspond to the current value of the current gain β. The hydrogen production-voltage curves illustrated in FIG. 5 show variance by temperature (e.g., temperature at the electrolytic cells). Load curves 502, 504 correspond to different values for the current gain β.

In practice, the hydrogen production-voltage curve for an electrolyzer system will have a shape that depends various factors including the temperature of the electrolytic cells and the irradiance incident on the photovoltaic array. Accordingly, maximizing the hydrogen production rate H will involve finding a value of the current gain β that intersects a difficult-to-calculate curve at its maximum.

Figure 6:
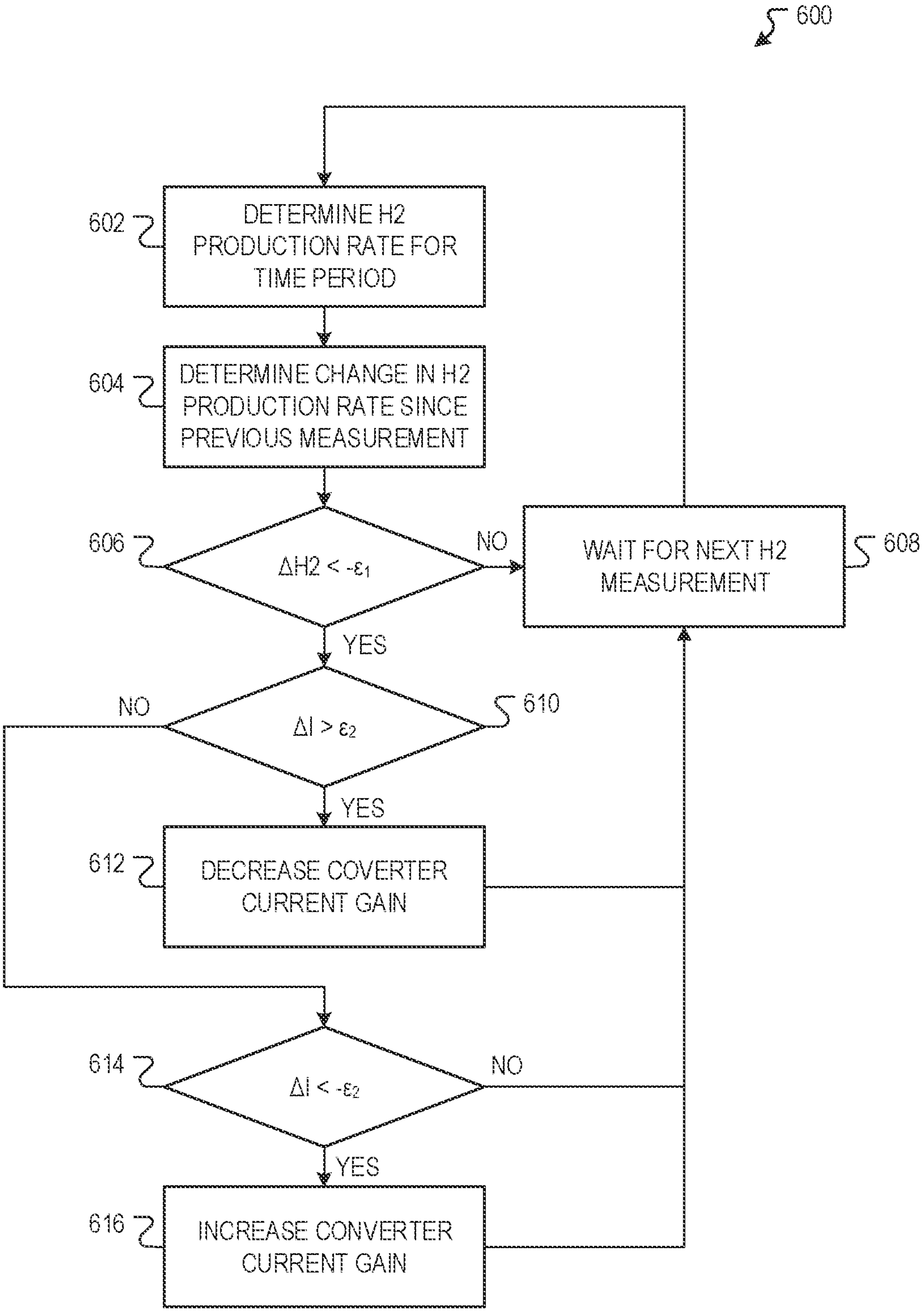
FIG. 6 is a flowchart showing one example of a process flow that may be executed by a converter controller of an electrolyzer system, such as the electrolyzer system of FIG. 1, to determine a converter current gain β to maximize the rate of hydrogen production for a given set of conditions.

FIG. 6 is a flowchart showing one example of a process flow 600 that may be executed by a converter controller of an electrolyzer system, such as the electrolyzer system 100 of FIG. 1, to determine a converter current gain β to maximize the rate of hydrogen production for a given set of conditions. At operation 602, the converter controller determines a hydrogen (H2) production rate H for a time period. The time period may be any suitable time period such as, for example, ten seconds, one minute, ten minutes, thirty minutes, etc. The converter controller may determine the rate of hydrogen production in any suitable manner. In some examples, the converter controller receives data indicating a measurement of the mass of hydrogen (H2) produced by the electrolytic cells during the time period such as, for example, from a flow meter or similar suitable sensor. In other examples, the converter controller calculates a mass of hydrogen produced during the time period using a calculation based on the stack current Is and load voltage V during the time period, for example, using Equation [6] above. The converter controller, for example, may store a value or values for the stack efficiency η for a given temperature and pressure and may receive values for the temperature and pressure at the electrolytic cells during the time period.

At operation 604, the converter controller determines the change in hydrogen production rate between the time period considered at operation 602 and the previous time period or time periods. If, at operation 606, the difference is not less than a negative hydrogen threshold $-\varepsilon_1$, meaning that the hydrogen production rate has not declined by more than the absolute value of the hydrogen threshold $\varepsilon_1$, then the converter controller may wait for the next hydrogen production rate measurement at 608 and then proceed again to operation 602.

If the hydrogen production rate change is less than $-\varepsilon_1$, the converter controller may determine, at operation 610, whether the stack current Is has increased during the time period by more than a current threshold $\varepsilon_2$. If the decrease in hydrogen production rate detected at operation 606 is accompanied by an increase in the current Is by more than the current threshold $\varepsilon_2$, it may indicate that the electrolyzer system is operating at a load voltage V that is lower than the load voltage Vat the peak of the hydrogen production-voltage curve at that time. Accordingly, the converter controller may, at operation 612, may decrease the converter current gain β by a first increment. The increment may be any suitable value such as, for example, 0.05, 0.1, 0.5, etc. Upon decreasing the current gain β, the converter controller may wait for the next hydrogen measurement at operation 608.

If, at operation 610, the converter controller determines that the stack current Is has not increased by more than the current threshold $\varepsilon_2$, it may determine, at operation 614, whether the stack current Is went down over the time period by more than the current threshold $\varepsilon_2$. (In some examples, the operation 614 may use a different threshold than the operation 610.) If the reduction in hydrogen production rate determined at operation 606 is accompanied by a decrease in the stack current Is greater than the threshold $\varepsilon_2$, it may indicate that the electrolyzer system is operating at a load voltage V that is higher than the peak of the hydrogen production-voltage curve at that time. Accordingly, the converter controller may increase the converter current gain β at operation 616. The increase at operation 616 may be, for example, by the same increment by which the current gain β is decreased at operation 612 or a different increment. After increasing the current gain β, the converter controller may wait for the next hydrogen measurement at operation 608.

Figure 7:
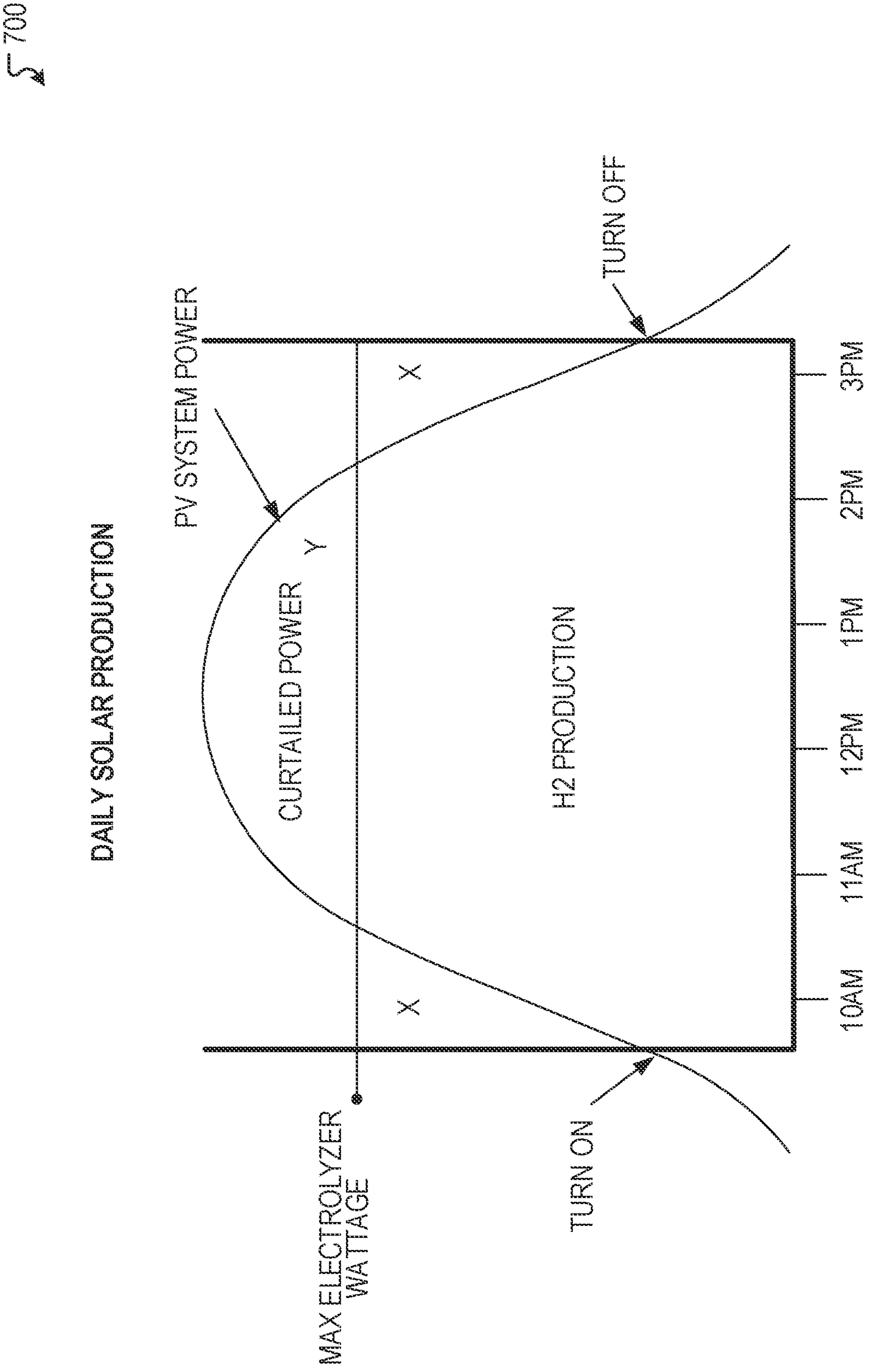
FIG. 7 is a plot showing one example of the power generated by a photovoltaic array powering one or more electrolyzer stacks.

In some examples, the converter controller is also configured to manage the current gain β of the converter to keep the power dissipated at the electrolytic cells below a threshold level. FIG. 7 is a plot 700 showing one example of the power generated by a photovoltaic array, such as the photovoltaic array 101, powering one or more electrolyzer stacks. The horizontal axis of the plot indicates time. The vertical axis of the plot indicates power. The curve labeled "PV System Power" shows the power generated by the photovoltaic array over the day. The vertical line labeled "Turn-On" indicates when the electrolyzer system is turned on (e.g., when the electrolyzer stack or stacks are coupled to the photovoltaic array). The vertical line labeled "Turn-Off" indicates when the electrolyzer system is turned off (e.g., when the electrolyzer stack or stacks are disconnected from the photovoltaic array). In this example, the converter controller is configured to modulate the current gain β of the converter to prevent the power dissipated at the electrolytic cells below a maximum wattage, indicated by the vertical line labeled "Max Electrolyzer Wattage."

In this example, the photovoltaic array begins producing power before the electrolyzer system is turned on, e.g., by the converter controller and/or by a system controller. For example, the power generated by the photovoltaic array prior to turn-on may not be sufficient to efficiently generate hydrogen. After the electrolyzer system is turned-on, the power generated by the photovoltaic array continues to rise (e.g., as irradiance due to sunlight increases). The converter controller modulates the current gain β of the converter to maximize hydrogen production for the power produced by the photovoltaic array, for example, as described with respect to FIGS. 4-6, until the maximum electrolyzer wattage is reached. At this point, the converter controller begins to control the current gain β to prevent the power dissipated at the electrolyzer from exceeding the maximum electrolyzer wattage. When the power generated by the photovoltaic array drops below a turn-off threshold, the converter controller and/or system controller turns the electrolyzer system off.

As shown by FIG. 7, when the maximum power dissipated at the electrolyzer system is increased, the Max Electrolyzer Wattage line rises. As the maximum power is increased, however, the gain in hydrogen for a further increase in the maximum power is reduced. Accordingly, in some circumstances, it may be more cost effective to operate an electrolyzer system at with a maximum power as shown in FIG. 7.

Figure 8:
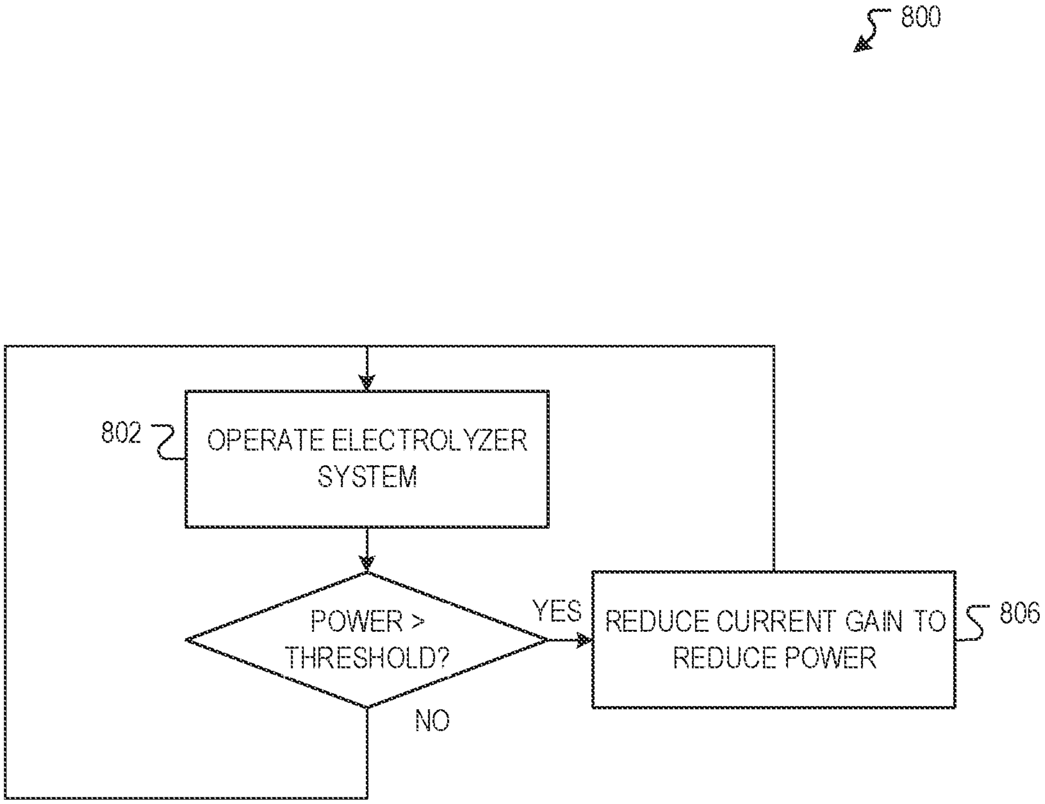
FIG. 8 is a flow chart showing one example of a process flow that may be executed by a converter controller of an electrolyzer system to maintain the power dissipated at the electrolyzer stack or stacks below a threshold level.

FIG. 8 is a flow chart showing one example of a process flow 800 that may be executed by a converter controller of an electrolyzer system, such as the electrolyzer system 100, to maintain the power dissipated at the electrolyzer stack or stacks below a threshold level. At operation 802, the converter controller operates the electrolyzer system, for example, as described herein. In some examples, operating the electrolyzer system at operation 802 may include modulating the current gain β of the converter to maximize hydrogen production as described herein with respect to FIGS. 4-6. At operation 804, the converter controller determines if the power dissipated at the electrolyzer system is greater than a threshold. The threshold may be the power limit for the electrolyzer system or, in some examples, may be below the power limit for the electrolyzer so as to provide a safety margin. In some examples, the operation 804 is executed periodically during operation of the electrolyzer system such as, for example, every thirty seconds, every minute, etc.

If the power dissipated at the electrolyzer system does not exceed the threshold at operation 804, the converter controller may continue to operate the electrolyzer system at operation 802. If the power dissipated at the electrolyzer system does exceed the threshold at operation 804, then the converter controller may reduce the current gain β of the converter to reduce the dissipated power at operation 806.

Figure 9:
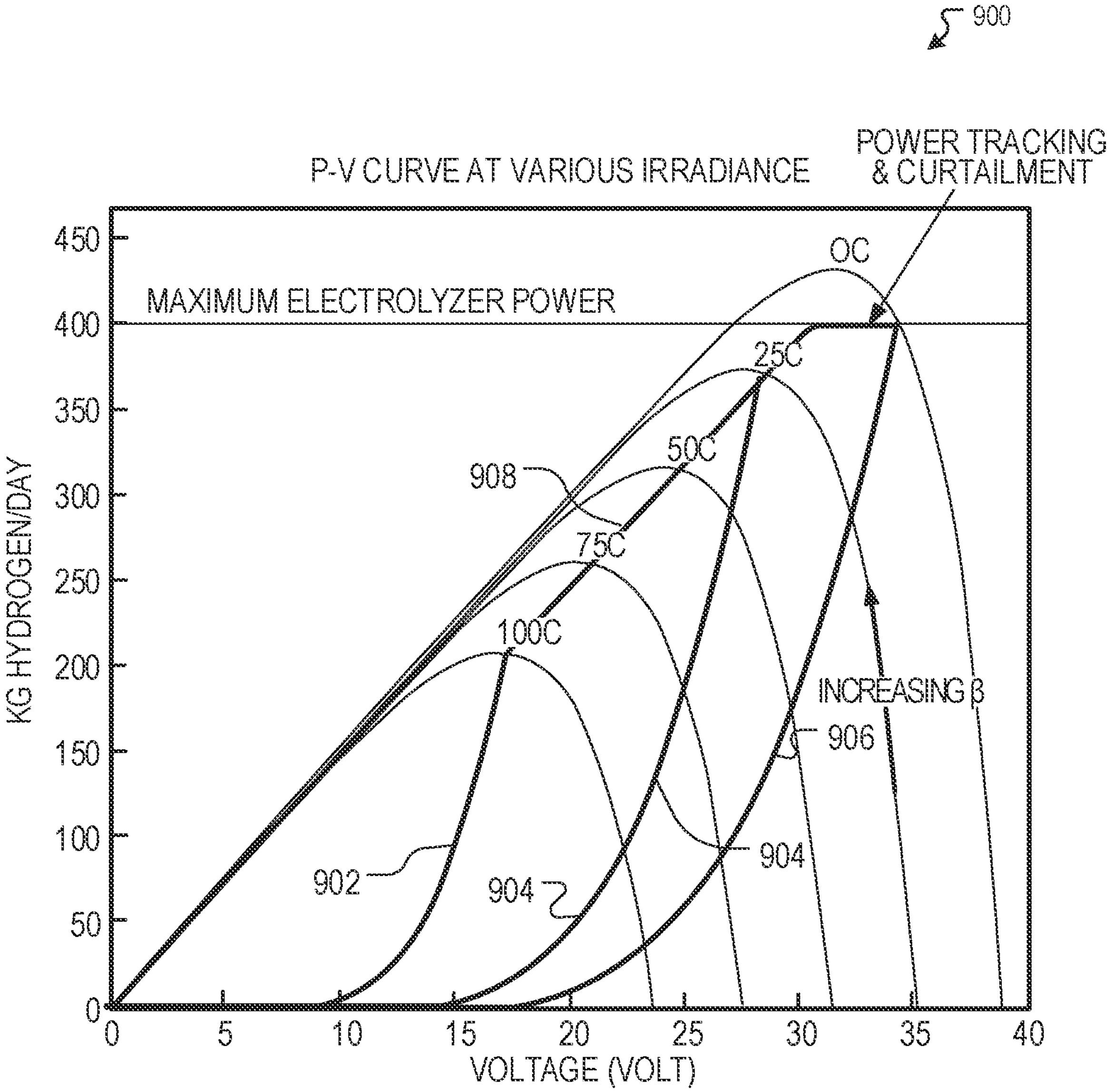
FIG. 9 is a plot showing example hydrogen production-voltage curves and load curves for an electrolyzer system, such as the electrolyzer system of FIG. 1.

FIG. 9 is a plot 900 showing hydrogen production-voltage curves and load curves for an electrolyzer system, such as the electrolyzer system 100 of FIG. 1. FIG. 9 illustrates an example implementation of the process flow 800 of FIG. 8. In the example of FIG. 9, irradiance is held constant and changes in the hydrogen production-voltage curve is solely due to a change in temperature. The plot 900 also shows three example load curves 902, 904, 906 corresponding to different values of the current gain β of the converter. In this example, the temperature of the electrolyzer stack or stacks is initially 100 C and decreases to 0 C.

When the electrolyzer temperature is 100 C, the converter controller modulates the current gain β of the converter to a value corresponding to load curve 902 to maximize hydrogen production. As the temperature decreases, the converter controller begins to decrease the current gain β of the converter to increase the load voltage and thereby increase hydrogen production as described herein with respect to FIGS. 4-6. The intersection between the load curves 902, 904, 906 and the hydrogen production-voltage curves at different temperatures is shown by curve 908.

Between 25 C and 0 C, the point of maximum hydrogen production rate exceeds the maximum electrolyzer power. Accordingly, as described with respect to the process flow 800, the converter controller continues to decrease the current gain β to prevent the power dissipated at the electrolyzer from exceeding the threshold. As shown, this may result in a hydrogen production rate that is less than the maximum for conditions.

In some examples, the converter controller and/or system controller of an electrolyzer system is configured to manage the turn-on and turn-off of the electrolyzer system. Referring to FIG. 1, for example, the converter controller and/or system controller may actuate a switch or switches to alternately connect or disconnect the electrolyzer stacks and/or converter system from the photovoltaic array. Generally, the electrolyzer system may be turned on when the power produced by the photovoltaic system exceeds a threshold level. For example, as described herein, it may be inefficient or even harmful to the electrolytic cells to operate the electrolyzer system at less than a minimum power level.

Figure 10:
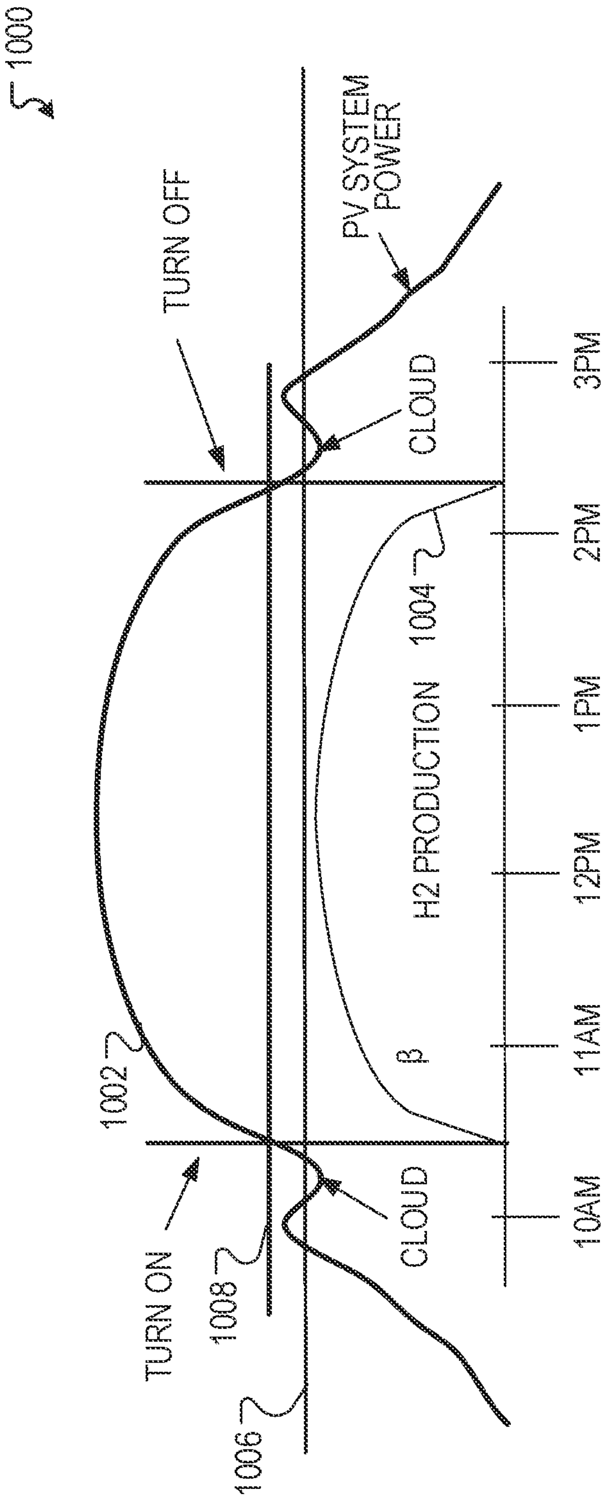
FIG. 10 is a plot showing the behavior of an example electrolyzer system, such as the electrolyzer system of FIG. 1, over a day.

In some circumstances, however, the power generated by the photovoltaic array may fluctuate around the threshold level, which could potentially cause the electrolyzer system to turn-on and off in quick succession. For example, the power generated by the photovoltaic array may increase as the sun rises in the morning and decrease as the sun sets in the evening. If the irradiance incident on the array varies for other reasons, such as, for example, by a cloud in the sky, then the ramp up or ramp down of photovoltaic array power may not be consistent. This is illustrated by FIG. 10, which shows a plot 1000 showing the behavior of an example electrolyzer system over the course of a day. The plot 1000 includes a curve 1002 showing power generated by the photovoltaic array and a curve 1004 showing hydrogen production. The minimum power for turning on the electrolyzer system is indicated by a minimum electrolyzer power line 1006. A first vertical line labeled "Turn-On" indicates when the electrolyzer system turns on. A second vertical line labeled "Turn-Off" indicates when the electrolyzer system turns off.

The curve 1002 demonstrate that, in this example, the photovoltaic array power initially exceeds the Min Electrolyzer Wattage at about 10:00 a.m. Several minutes later, however, the power generated by the photovoltaic array again dips below the minimum electrolyzer power line 1006 when a cloud obstructs the photovoltaic array. As described herein, preparatory steps for turning on the electrolyzer system may be energy-intensive and time-consuming. Accordingly, the system controller may be configured to determine and apply a turn-on threshold that is higher than the minimum electrolyzer power. This is shown in FIG. 10. As shown, the electrolyzer system is not turned on when the electrolyzer power initially exceeds the minimum electrolyzer power line 1006. Instead, the electrolyzer system is turned-on after the electrolyzer power exceeds the second higher turn-on threshold 1008. In this way, the drop in photovoltaic power back below the electrolyzer minimum power level shortly after 10:00 a.m. does not require the electrolyzer system to be turned-off.

The operation of the turn-on threshold 1008 is also demonstrated at FIG. 10 at turn off. As shown, the electrolyzer system is turned-off when the power generated by the photovoltaic array drops below the minimum electrolyzer power line 1006. As shown, this may occur initially shortly after 2:00 p.m. when a cloud again obstructs sunlight to the photovoltaic array. After the cloud passes, the photovoltaic array power again begins to climb. Because it does not climb above the turn-on threshold 1008, the electrolyzer system remains off.

Figure 11:
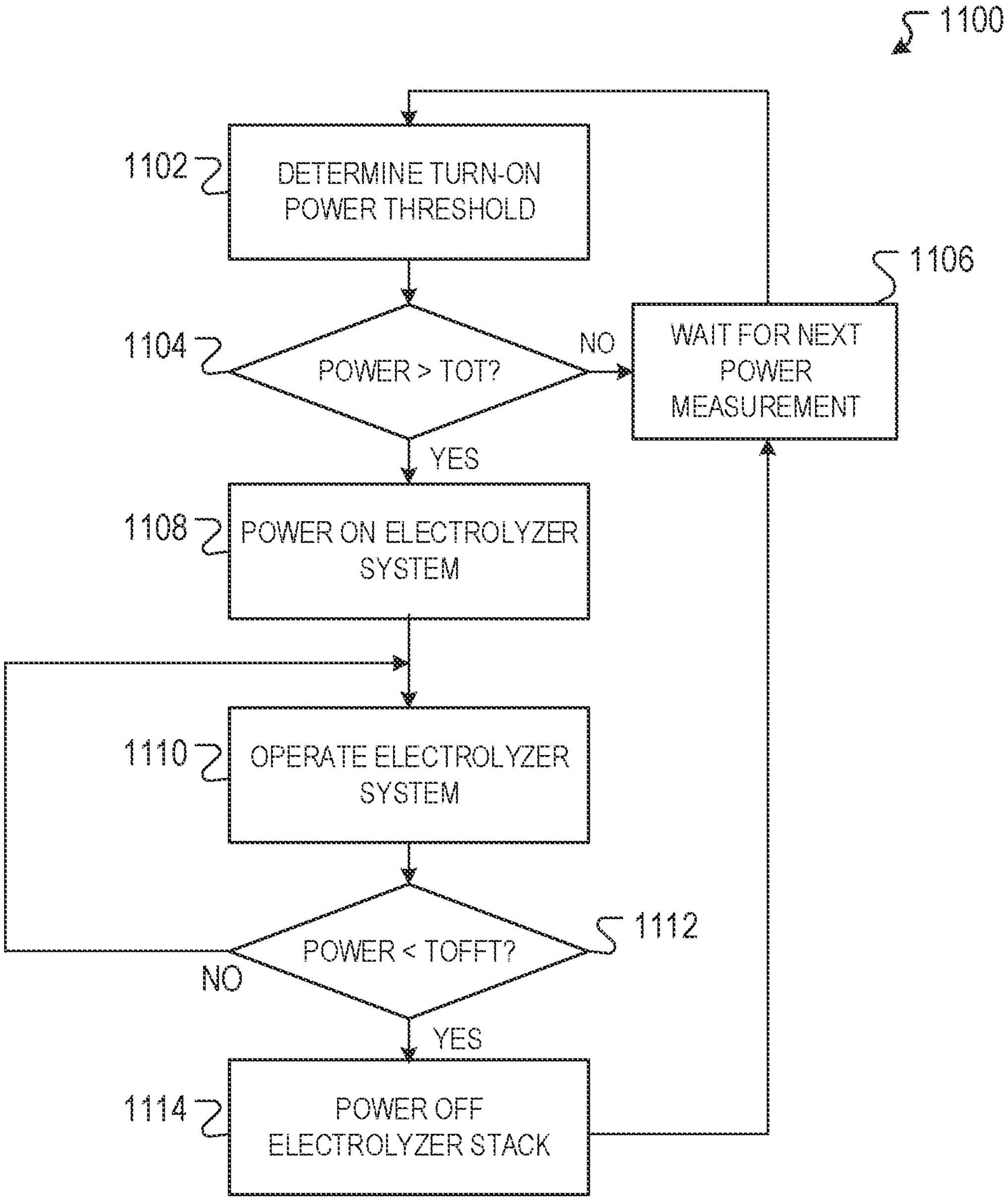
FIG. 11 is a flowchart showing one example of a process flow that may be executed by a converter controller and/or a system controller of an electrolyzer system operate an electrolyzer system using a turn-on threshold.

FIG. 11 is a flowchart showing one example of a process flow 1100 that may be executed by a converter controller and/or a system controller of an electrolyzer system operate an electrolyzer system using a turn-on threshold. At operation 1102, the system controller determines the turn-on threshold. The turn-on threshold may be determined, for example, based on various factors including the time of day, the date, the location of the photovoltaic array, etc. These factors may indicate, for example a likelihood of a weather event or other condition that may cause the photovoltaic array power to fluctuate around the electrolyzer minimum power level. The factors for determining the turn-on threshold may also indicate how far the photovoltaic array is likely to fall after having initially crossed the electrolyzer minimum power level.

In some examples, the turn-on threshold can also be determined considering the operating range of the electrolyzer stack being utilized. For example, an electrolyzer may have an operating range that is a portion of its nominal power capacity (e.g., between 5% and 100% of the nominal power). The turn-on threshold may be determined based on when photovoltaic array is likely to generate power within the operating range of the electrolyzer stack. Consider an example in which a 1 MW electrolyzer stack has an operating range of between 50 kW and 1 MW. The system controller may utilize time, date, geographic location data, weather data, etc, to predict the power that the photovoltaic array is likely to produce. If the photovoltaic array is likely to consistently produce a power above 50 kW, then the electrolyzer cells may be turned on. In some examples, the turn-on threshold may be set above the minimum operating range of the electrolyzer stack. In the example above with the 1 MW electrolyzer stack, the turn-on threshold may be set to a value greater than 50 kW (e.g., 100 kW). Accordingly, when the photovoltaic array generates a power greater than the threshold, it may be unlikely to later dip below the operating range of the electrolyzer stack.

At operation 1104, the system controller determines if the power generated by the photovoltaic array exceeds the turn-on threshold. If not, the system may wait for a next photovoltaic array power measurement at operation 1106 and then again determine whether the power generated by the photovoltaic array exceeds the turn-on threshold at operation 1104.

If the power generated by photovoltaic array at operation 1104 does exceed the turn-on threshold, then the system controller turns-on the electrolyzer system at operation 1108. This can include, for example, electrically coupling the electrolyzer stack or stacks to the photovoltaic array and/or providing water or other reactants to the electrolyzer stack or stacks. At operation 1110, the system controller operates the electrolyzer system. This can include, for example, one or more converter controllers operating as described herein to maximum hydrogen production and/or keep total power below a power threshold.

At operation 1112, the system controller determines whether the power generated by the photovoltaic array is less than a turn-off threshold. The turn-off threshold, in some examples, is the electrolyzer minimum power level. In other examples, the turn-off threshold may be the same as the turn-on threshold. In yet other examples, the turn-off threshold can be determined based on factors similar to the factors for determining the turn-on threshold. If the photovoltaic array power is not less than the turn-off threshold, the system controller continues to operate the electrolyzer system at operation 1110. If the photovoltaic array power is less than the turn-off threshold, then the system controller turns-off the electrolyzer system at operation 1114 and waits for a next measurement of the photovoltaic array power at operation 1106.

Figure 12:
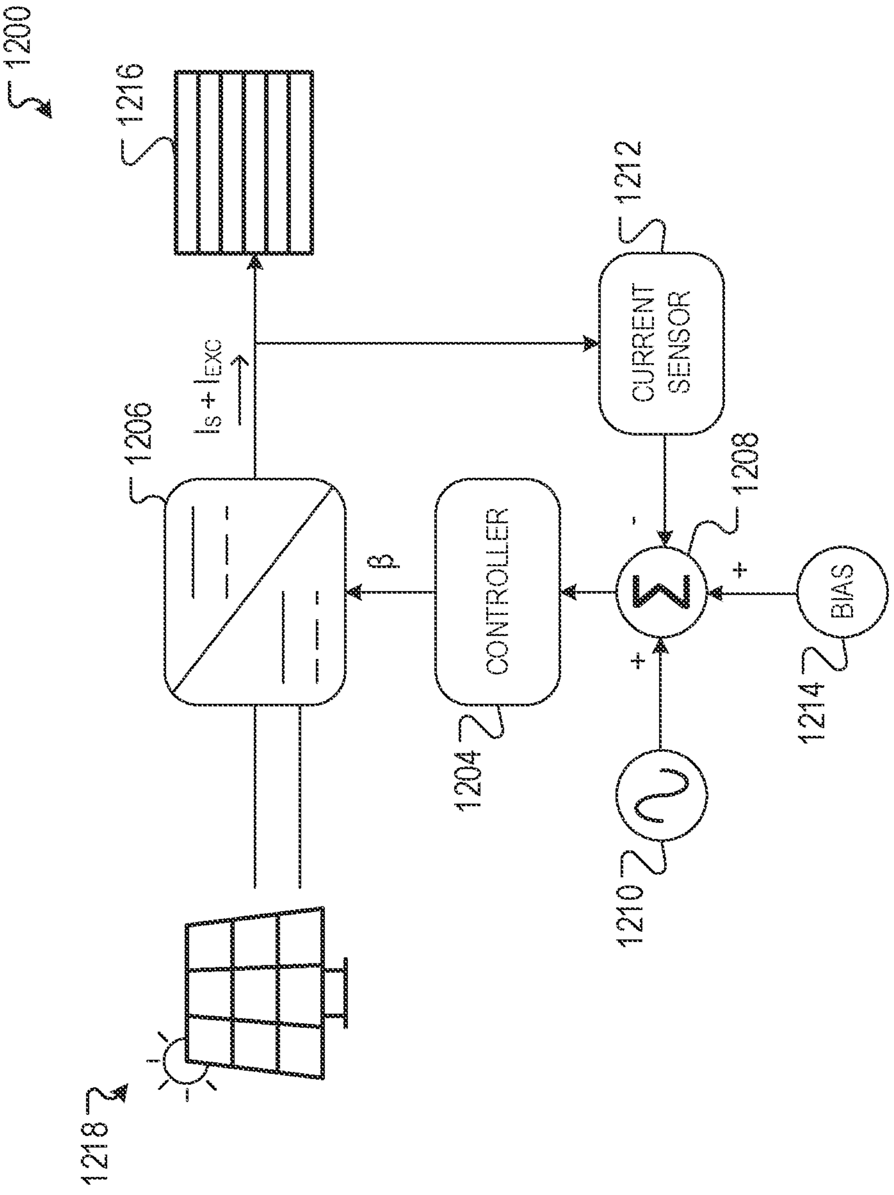
FIG. 12 is a diagram showing one example of an electrolyzer system that is configured to provide an excitation signal to an electrolyzer stack to facilitate electrochemical impedance spectroscopy (EIS).

FIG. 12 is a diagram showing one example of an electrolyzer system 1200 that is configured to provide an excitation signal to an electrolyzer stack to facilitate EIS. The electrolyzer system 1200 includes a photovoltaic array 1218, a converter 1206 and a converter controller 1204. The photovoltaic array 1218 provides a stack current Is to the electrolyzer stack 1216, where the stack current Is is determined by the converter 1206 applying a current gain R as described herein. In this example, electrolyzer stack 1216 is electrically coupled in parallel with the converter 1206 with the entire load of the photovoltaic array 1218 being provided to converter 1206.

In the example of FIG. 12, a feedback loop is implemented between the stack 1216 and converter 1206 to apply an excitation current $I_{EXE}$ to the stack current Is provided by the photovoltaic system. The excitation current $I_{EXE}$ may comprise a direct current bias, provided by a bias supply 1214, and a time-varying signal provided by an excitation signal generator 1210.

The current provided to the stack 1216 may be the sum of the stack current Is and the excitation current $I_{EXE}$. A current sensor 1212 senses the current provided to the stack 1216. A summer 1208 generates an error signal that is the difference between the current provided to the stack 1216 and the desired excitation current from the sum of the bias supply 1214 and an reference excitation signal generated by the excitation signal generator 1210. The error signal is provided to the converter controller 1204. The converter controller 1204 generates a value of the current gain β for the converter 1206 that tends to drive the error signal towards zero.

In various examples, the frequency of the time-varying signal provided by the excitation signal generator may be varied to provide excitation signals over a suitable frequency spectrum. The impedance of the stack 1216 may be monitored over the applied frequency spectrum, according to EIS techniques, to monitor properties of the system 1200.

Figure 13:
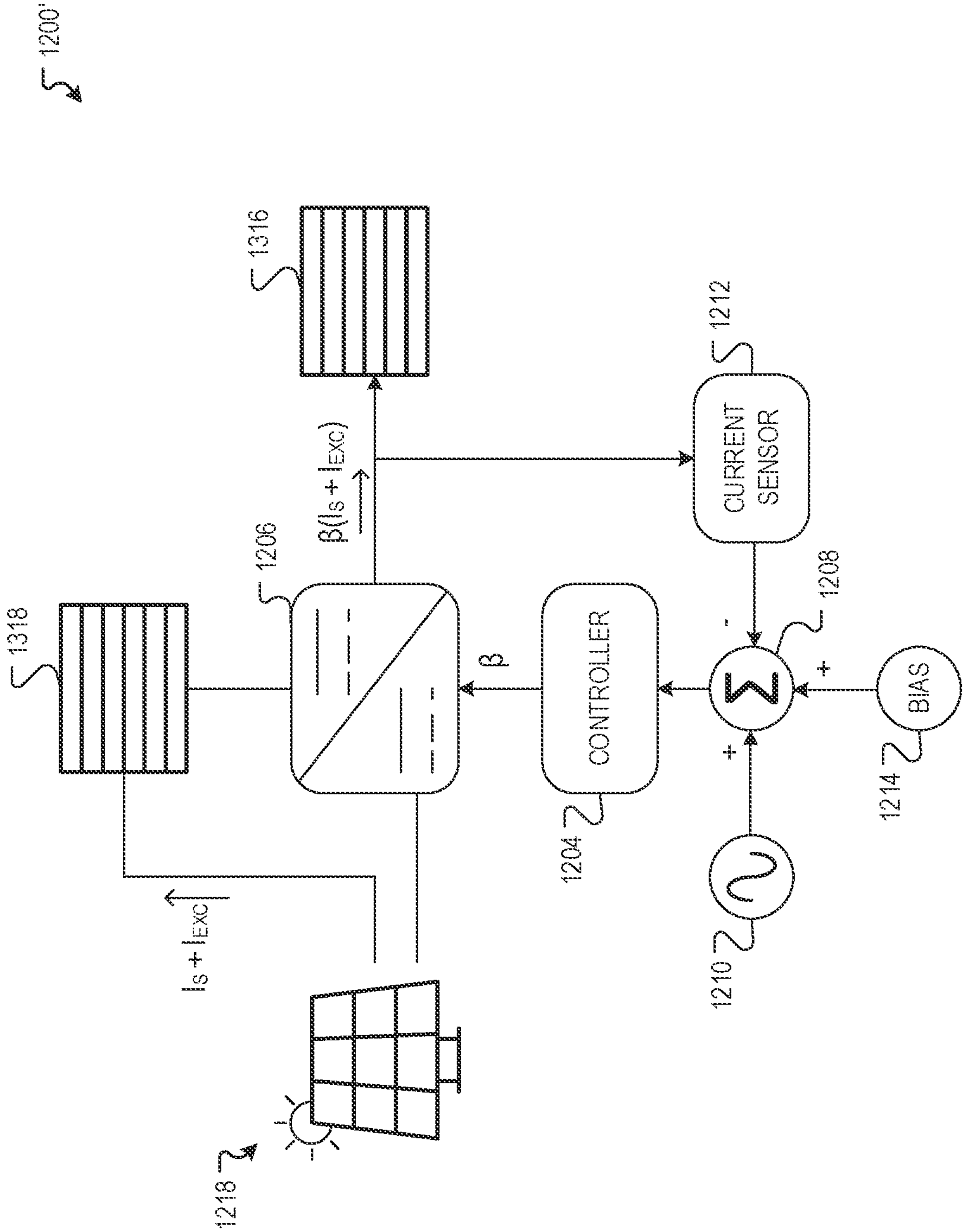
FIG. 13 is a diagram showing another example of the electrolyzer system of FIG. 12 with an alternative electrolyzer stack arrangement.

FIG. 13 is a diagram showing another example of an electrolyzer system 1200'. The electrolyzer system 1200' comprises the converter 1206, controller 1204, excitation signal generator 1210, bias supply 1214, and summer 1208 similar to the similarly-numbered components from FIG. 12. In this example, a first electrolyzer stack 1318 and a balance electrolyzer stack 1316 are electrically coupled to the converter 1206 and photovoltaic array 1218 in a manner similar to that shown in FIG. 1. Here, the electrolyzer stack 1318 is electrically coupled in series with the photovoltaic array 1218 and the converter 1206. The balance stack 1316 is electrically coupled in parallel with the converter 1206 and/or at the output of the converter 1206. IN this example, the current provided to the first stack 1318 is the stack current Is plus the excitation current/Exc. The current at the balance stack 1316 is the sum of the stack current Is and excitation current $I_{EXC}$ multiplied by the current gain β of the converter 1206. In this example, the controller 1204 is configured to generate the current gain β of the converter 1206 to drive the current at the first stack 1318 to the sum of Is and excitation current $I_{EXC}$ as described herein.

Figure 14:
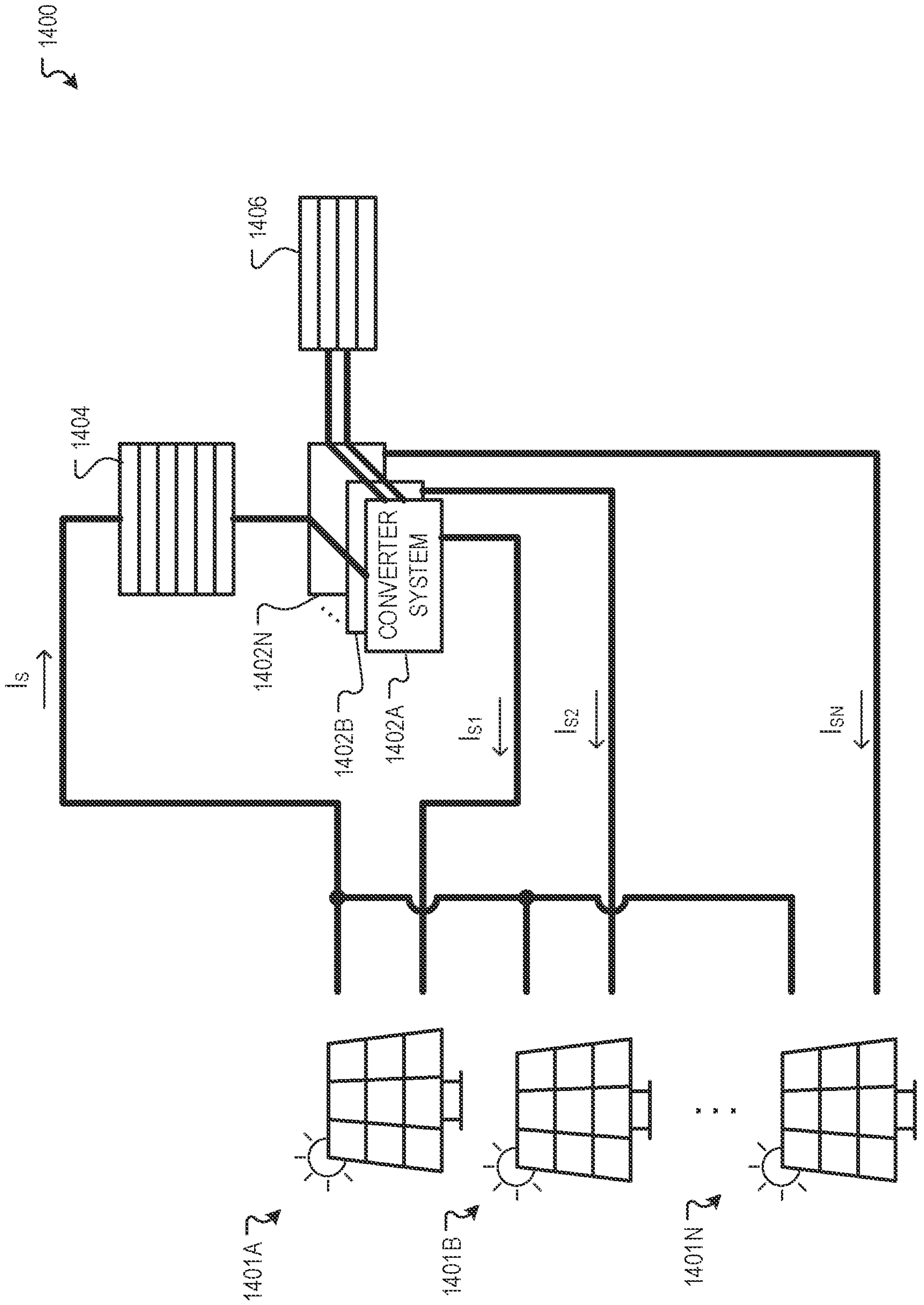
FIG. 14 is a diagram showing one example of an electrolyzer system comprising multiple photovoltaic arrays and multiple converter systems.

FIG. 14 is a diagram showing one example of an electrolyzer system 1400 comprising multiple photovoltaic arrays 1401A, 1401B, 1401N and multiple converter systems 1402A, 1402B, 1402N. The photovoltaic arrays 1401A, 1401B, 1401N and converter systems 1402A, 1402B, 1402N provide power to electrolyzer stacks including a first electrolyzer stack 1404 and a balance electrolyzer stack 1406. Although only two electrolyzer stacks 1404, 1406 are shown in FIG. 14, it will be appreciated that additional electrolyzer stacks may be used.

Each photovoltaic array 1401A, 1401B, 1401N is electrically coupled in series with the first electrolyzer stack 1404 and one of the converter systems 1402A, 1402B, 1402N. For example, the photovoltaic array 1401A is electrically coupled in series with the first electrolyzer stack 1404 and the converter system 1402A. The photovoltaic array 1401B is electrically coupled in series with the first electrolyzer stack 1404 and the converter system 1402B, and so on.

The converter systems 1402A, 1402B, 1402N are electrically coupled to the first converter stack 1404 and the respective photovoltaic arrays 1401A, 1401B, 1401N. In this example, the converter system 1402A is electrically coupled between the first converter stack 1404 and the photovoltaic array 1401A. The converter system 1402B is electrically coupled between the first electrolyzer stack 1404 and the photovoltaic array 1401B, and so on. The balance stack 1406 is connected across the outputs of all of the converter systems 1402A, 1402B, 1402N in parallel.

In this arrangement, each photovoltaic array 1401A, 1401B, 1401N provides respective stack current portions $I_{S1}$, $I_{S2}$, $I_{SN}$. The total stack current Is at the first electrolyzer stack 1404 is the sum of the stack current portions $I_{S1}$, $I_{S2}$, $I_{SN}$. The current IN at the balance stack 1406 may be given by Equation [7] below:

$$I_N = \beta 1 I_{S1} + \beta 2 I_{S2} + \ldots \beta N I_{SN} \quad [7]$$

In Equation [1], β1, β2, and βN are the current gains of the respective converter systems 1402A, 1402B, 1402N.

The arrangement shown in FIG. 14 may provide advantages. For example, when the electrolyzer stacks 1404, 1406 have variable power requirements, photovoltaic arrays 1401A, 1401B, 1401N may be switched into and out of the system 1400 along with their corresponding converter system 1402A, 1402B, 1402N without the need to shut down the electrolyzer stacks 1404, 1406.

In some examples, the respective current gains of each converter system 1402A, 1402B, 1402N are separately controlled. In this way, the converter systems 1402A, 1402B, 1402N may be configured to modify the stack current portions $I_{S1}$, $I_{S2}$, $I_{SN}$ from the respective photovoltaic systems 1401A, 1401B, 1401N based on the conditions at the photovoltaic systems 1401A, 1401B, 1401N. For example, the stack current portion $I_{S1}$ is provided by the converter system 1402A to the photovoltaic array 1401A. The stack current portion $I_{S2}$ is provided by the converter system 1402B to the photovoltaic array 1401B. The stack current portion $I_{SN}$ is provided by the converter system 1402N to the photovoltaic array 1401N. In some examples, the respective converter systems 1402A, 1402B, 1402N may separately modify their respective β to keep the photovoltaic arrays 1401A, 1401B, 1401N operating at or near its maximum power point and/or the power point of maximum hydrogen production, as given by Equation [6] above. In this way, each of the photovoltaic arrays may be operated independently of the other arrays and the total power extraction may be regulated to maximize hydrogen production.

Figure 15:
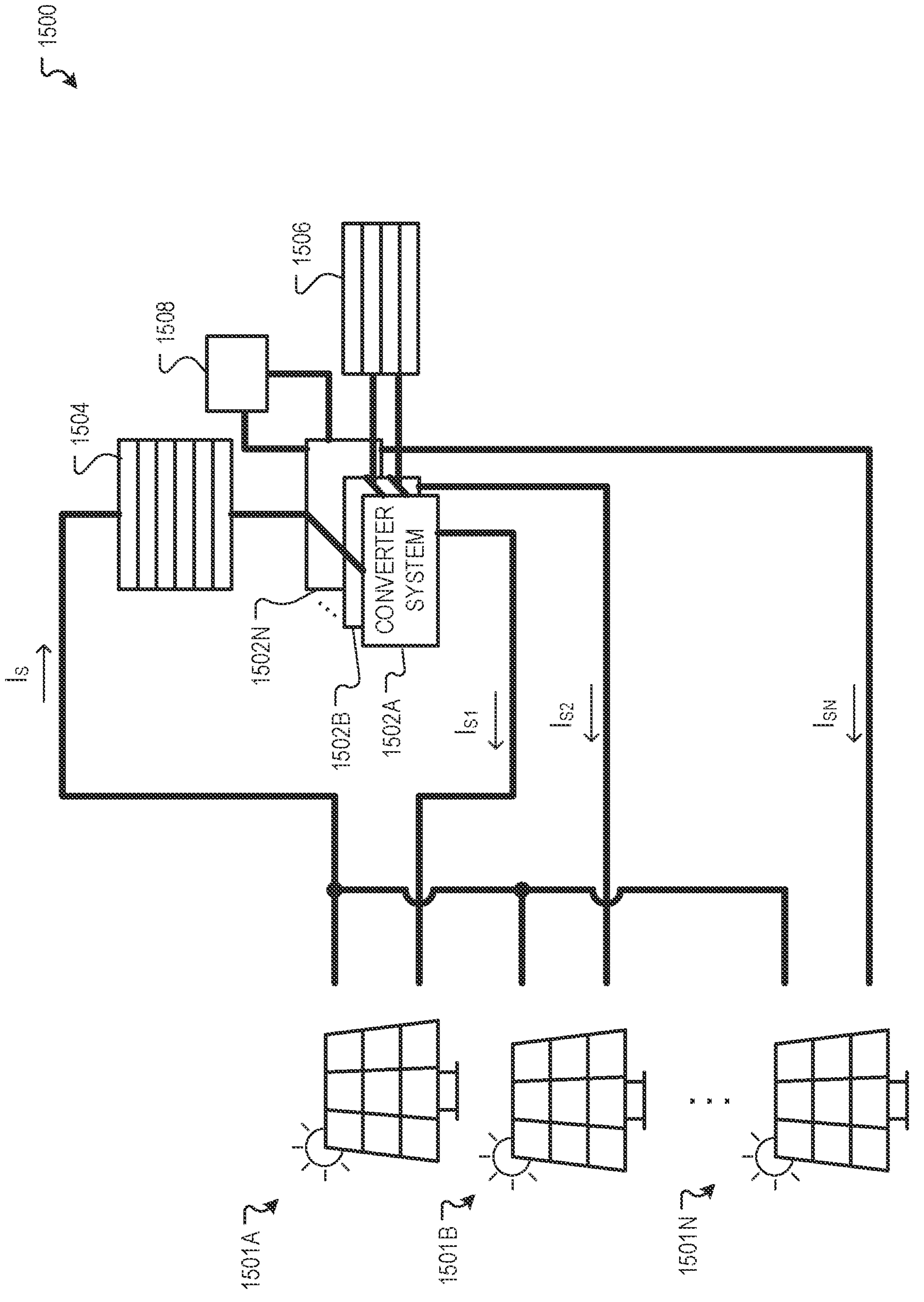
FIG. 15 is a diagram showing another one example of an electrolyzer system comprising multiple photovoltaic arrays and multiple converter systems as well as an alternative load.

FIG. 15 is a diagram showing another one example of an electrolyzer system 1500 comprising multiple photovoltaic arrays 1501A, 1501B, 1501N and multiple converter systems 1502A, 1502B, 1502N including an alternative load 1508. The photovoltaic arrays 1501A, 1501B, 1501N and converter systems 1502A, 1502B, 1502N provide power to electrolyzer stacks including a first electrolyzer stack 1504, a balance electrolyzer stack 1506, and an alternative load 1508. The alternative load may be any suitable load such as, for example, a battery or bank of battery cells. Also, although only two electrolyzer stacks 1504, 1506 are shown in FIG. 15, it will be appreciated that additional electrolyzer stacks may be used.

As with the example of FIG. 14, each photovoltaic array 1501A, 1501B, 1501N is electrically coupled in series with the first electrolyzer stack 1504 and one of the converter systems 1502A, 1502B, 1502N. Also, like the example of FIG. 14, the converter systems 1502A, 1502B, 1502N are electrically coupled to the first converter stack 1504 and the respective photovoltaic arrays 1501A, 1501B, 1501N. In this example, the converter system 1502A is electrically coupled between the first converter stack 1504 and the photovoltaic array 1501A. The converter system 1502B is electrically coupled between the first electrolyzer stack 1504 and the photovoltaic array 1501B, and so on.

In the example of FIG. 15, the balance stack 1506 is electrically coupled across the outputs of the converter systems 1502A, 1502B while the alternative load 1508 is electrically coupled at the output of the converter 1502N. It will be appreciated that other permutations are contemplated. For example, the alternative load may be electrically coupled in parallel across more than one of the converter systems 1502A, 1502B, 1502N.

In the example of FIG. 15, the respective converter systems 1502A, 1502B, 1502N may apply current gains β1, β2, and βN as described with respect to FIG. 14. The converter system 1502N powering the alternative load, in some examples, may have its current gain βN modified by a converter controller based on the alternative load 1508. For example, when the alterative load is or includes a battery to be charged, a converter controller may monitor a state of charge of the battery and ensure that the charging current and voltage profiles provided to the battery are suitable for battery longevity and safety.

Figure 16:
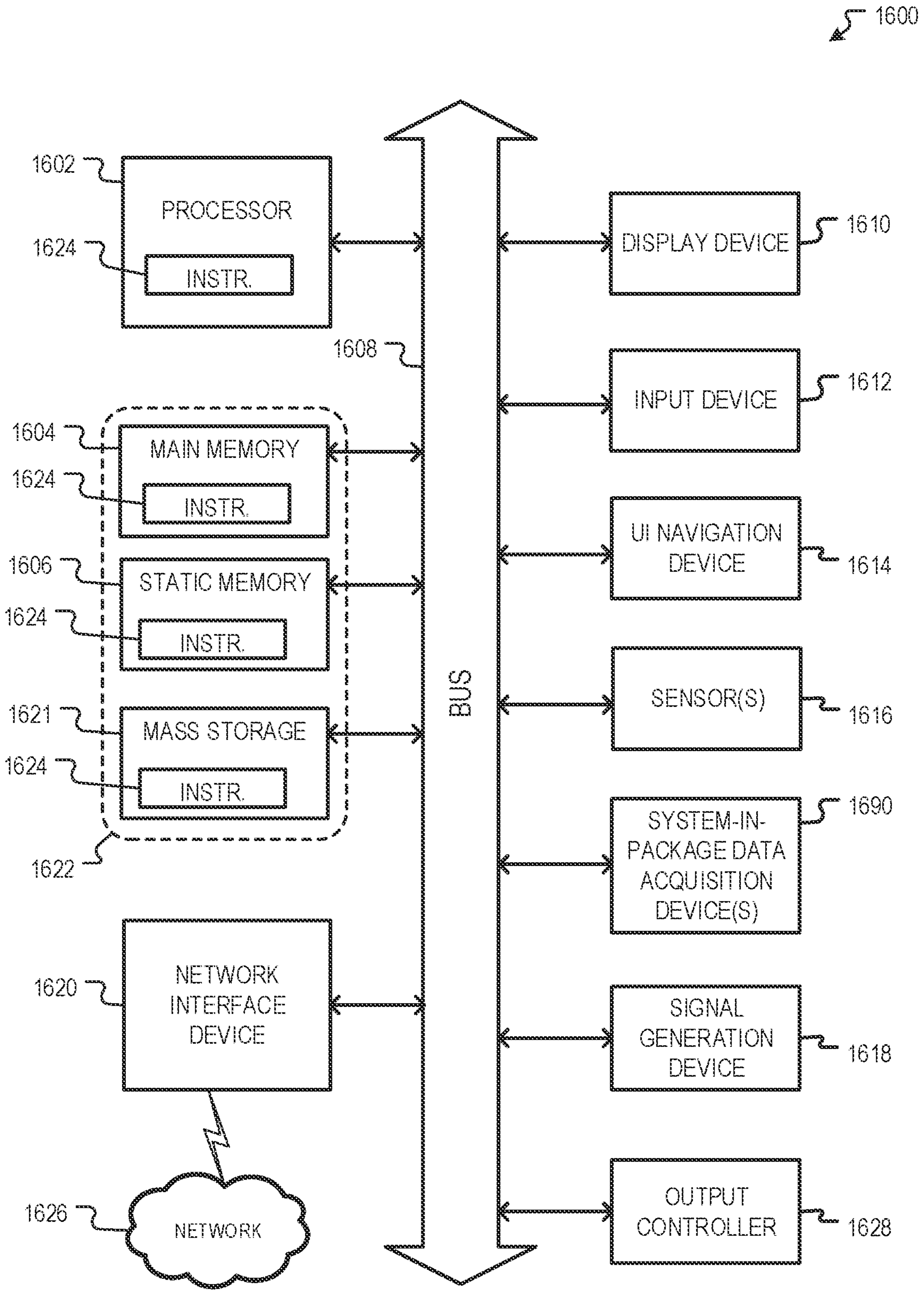
FIG. 16 is a block diagram illustrating an example of a machine upon which one or more embodiments may be implemented.

FIG. 16 is a block diagram of an example machine 1600 upon which any one or more of the techniques (e.g., methodologies) discussed herein may be performed. In alternative embodiments, the machine 1600 may operate as a standalone device or may be connected (e.g., networked) to other machines. In a networked deployment, the machine 1600 may operate in the capacity of a server machine, a client machine, or both in server-client network environments. In an example, the machine 1600 may act as a peer machine in a peer-to-peer (P2P) (or other distributed) network environment. The machine 1600 may be a personal computer (PC), a tablet PC, a set-top box (STB), a personal digital assistant (PDA), a mobile telephone, a web appliance, an IoT device, an automotive system, an aerospace system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant-massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation.

Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1600 may include a hardware processor 1602 (e.g., a central processing unit (CPU), a graphics processing unit (GPU), a hardware processor core, or any combination thereof, such as a memory controller, etc.), a main memory 1604, and a static memory 1606, some or all of which may communicate with each other via an interlink (e.g., bus) 1608. The machine 1600 may further include a display device 1610, an alphanumeric input device 1612 (e.g., a keyboard), and a user interface (UI) navigation device 1614 (e.g., a mouse). In an example, the display device 1610, alphanumeric input device 1612, and UI navigation device 1614 may be a touchscreen display. The machine 1600 may additionally include a storage device 1622 (e.g., drive unit); a signal generation device 1618 (e.g., a speaker); a network interface device 1620; one or more sensors 1616, such as a Global Positioning System (GPS) sensor, wing sensors, mechanical device sensors, temperature sensors, ICP sensors, bridge sensors, audio sensors, industrial sensors, a compass, an accelerometer, or other sensors; and one or more system-in-package data acquisition devices 1690. The system-in-package data acquisition device(s) 1690 may implement some or all of the functionality of the electrolyzer system 100. The machine 1600 may include an output controller 1628, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The storage device 1622 may include a machine-readable medium on which is stored one or more sets of data structures or instructions 1624 (e.g., software) embodying or utilized by any one or more of the techniques or functions described herein. The instructions 1624 may also reside, completely or at least partially, within the main memory 1604, within the static memory 1606, or within the hardware processor 1602 during execution thereof by the machine 1600. In an example, one or any combination of the hardware processor 1602, the main memory 1604, the static memory 1606, or the storage device 1621 may constitute the machine-readable medium.

While the machine-readable medium is illustrated as a single medium, the term "machine-readable medium" may include a single medium or multiple media (e.g., a centralized or distributed database, or associated caches and servers) configured to store the one or more instructions 1624.

The term "machine-readable medium" may include any transitory or non-transitory medium that is capable of storing, encoding, or carrying transitory or non-transitory instructions for execution by the machine 1600 and that cause the machine 1600 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1624 (e.g., software, programs, an operating system (OS), etc.) or other data that are stored on the storage device 1621 can be accessed by the main memory 1604 for use by the hardware processor 1602. The main memory 1604 (e.g., DRAM) is typically fast, but volatile, and thus a different type of storage from the storage device 1621 (e.g., an SSD), which is suitable for long-term storage, including while in an "off" condition. The instructions 1624 or data in use by a user or the machine 1600 are typically loaded in the main memory 1604 for use by the hardware processor 1602. When the main memory 1604 is full, virtual space from the storage device 1621 can be allocated to supplement the main memory 1604; however, because the storage device 1621 is typically slower than the main memory 1604, and write speeds are typically at least twice as slow as read speeds, use of virtual memory can greatly reduce user experience due to storage device latency (in contrast to the main memory 1604, e.g., DRAM). Further, use of the storage device 1621 for virtual memory can greatly reduce the usable lifespan of the storage device 1621.

The instructions 1624 may further be transmitted or received over a communications network 1626 using a transmission medium via the network interface device 1620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone Service (POTS) networks, and wireless data networks (e.g., Institute of Electrical and Electronics Engineers (IEEE) 802.11 family of standards known as Wi-Fi®, IEEE 802.16 family of standards known as WiMax®, IEEE 802.15.4 family of standards, P2P networks), among others. In an example, the network interface device 1620 may include one or more physical jacks (e.g., Ethernet, coaxial, or phone jacks) or one or more antennas to connect to the communications network 1626. In an example, the network interface device 1620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible or intangible medium that is capable of storing, encoding, or carrying instructions for execution by the machine 1600, and includes digital or analog communications signals or other tangible or intangible media to facilitate communication of such software.

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more claims thereof), either with respect to a particular example (or one or more claims thereof), or with respect to other examples (or one or more claims thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended; that is, a system, device, article, composition, formulation, or process that includes elements in addition to those listed after such a term in a claim are still deemed to fall within the scope of that claim. Moreover, in the following claims, the terms "first," "second," "third," etc. are used merely as labels, and are not intended to impose numerical requirements on their objects.

Method examples described herein may be machine- or computer-implemented at least in part. Some examples may include a computer-readable medium or machine-readable medium encoded with transitory or non-transitory instructions operable to configure an electronic device to perform methods as described in the above examples. An implementation of such methods may include code, such as microcode, assembly-language code, a higher-level-language code, or the like. Such code may include transitory or non-transitory computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read-only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above detailed description, various features may be grouped together to streamline the disclosure. This should not be interpreted as intending that an disclosed feature not listed in the list of claims is essential to any claim. Rather, inventive subject matter may lie in less than all features of a particular disclosed embodiment. Thus, the following claims are hereby incorporated into the detailed description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

The invention claimed is:

1. An electrolyzer system comprising:

a power supply configured to provide a stack current to a first electrolyzer stack electrically coupled to the power supply;

a converter electrically coupled to provide an excitation current to the first electrolyzer stack;

a converter controller to control the excitation current provided to the first electrolyzer stack; and an excitation signal generator configured to perform operations comprising generating a reference excitation signal, the converter controller being configured to perform operations comprising configuring the converter to generate the excitation current based at least in part on the reference excitation signal.

2. The electrolyzer system of claim 1, the excitation current comprising a direct current component and a time-varying component, the time-varying component being based at least in part on the reference excitation signal.

3. The electrolyzer system of claim 2, further comprising a current sensor electrically coupled to sense the stack current, the generating of the excitation current also being based at least in part on an output of the current sensor.

4. The electrolyzer system of claim 3, further comprising, a bias supply configured to generate a direct current component of the excitation current, the generating of the excitation current also being based at least in part on the direct current component of the excitation current and the reference excitation signal.

5. The electrolyzer system of claim 1, the converter controller being further configured to perform operations comprising modulating a current gain of the converter to generate the excitation current, the modulating being based at least in part on the reference excitation signal.

6. The electrolyzer system of claim 1, the excitation signal generator being further configured to perform operations comprising varying the reference excitation signal over a frequency spectrum.

7. The electrolyzer system of claim 1, the power supply comprising a photovoltaic array.

8. The electrolyzer system of claim 1, the power supply being electrically coupled in series with a balance electrolyzer stack, the stack current being provided to the balance electrolyzer stack and the first electrolyzer stack.

9. A method of operating an electrolyzer system, the electrolyzer system comprising a power supply electrically coupled to provide a stack current to a first electrolyzer stack electrically coupled to the power supply; a converter; a converter controller; and an excitation signal generator, the method comprising:

generating, by the excitation signal generator, a reference excitation signal;

configuring the converter, by the converter controller, to generate an excitation signal based at least in part on the reference excitation signal; and providing, by the converter, the excitation current to the first electrolyzer stack, a current provided to the first electrolyzer stack being based at least in part on the stack current and the excitation current.

10. The method of claim 9, the excitation current comprising a direct current component and a time-varying component, the time-varying component being based at least in part on the reference excitation signal.

11. The method of claim 10, the excitation current being based at least in part on an output of a current sensor electrically coupled to sense the stack current.

12. The method of claim 11, the excitation current also being based at least in part on a direct current component of the excitation current, and the reference excitation signal.

13. The method of claim 9, further comprising configuring, by the converter controller, the converter to generate the excitation current at least in part by modulating a current gain of the converter.

14. The method of claim 9, further comprising varying, by the excitation signal generator, the reference excitation signal over a frequency spectrum.

15. The method of claim 9, the stack current being provided by at least one photovoltaic array of the power supply.

16. The method of claim 9, further comprising providing, by the power supply, the stack current to a balance electrolyzer stack electrically coupled in series with the power supply.

17. An electrolyzer system comprising:

means for providing a stack current to a first electrolyzer stack;

a converter electrically coupled to provide an excitation current to the first electrolyzer stack;

means for controlling the excitation current provided to the first electrolyzer stack; and means for generating a reference excitation signal, the excitation current being based at least in part on the reference excitation signal.

18. The electrolyzer system of claim 17, the excitation current comprising a direct current component and a time-varying component, the time-varying component being based at least in part on the reference excitation signal.

19. The electrolyzer system of claim 18, further comprising means for sensing the stack current, the generating of the excitation current also being based at least in part on an output of the means for sensing the stack current.

20. The electrolyzer system of claim 19, further comprising, means for generating a direct current component of the excitation current, the generating of the excitation current also being based at least in part on the direct current component of the excitation current and the reference excitation signal.

* * * * *